US012751099B2

(12) United States Patent
Lee

(10) Patent No.: US 12,751,099 B2
(45) Date of Patent: Sep. 29, 2026

(54) IMAGE SENSOR

(71) Applicant: Samsung Electronics Co., Ltd., Suwon-si (KR)

(72) Inventor: Seung Joon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 353 days.

(21) Appl. No.: 18/535,076

(22) Filed: Dec. 11, 2023

(65) Prior Publication Data

US 2024/0194704 A1 Jun. 13, 2024

(30) Foreign Application Priority Data

Dec. 13, 2022 (KR) ........................ 10-2022-0173445

(51) Int. Cl.
*H10F 39/00* (2025.01)
*H10F 39/18* (2025.01)

(52) U.S. Cl.
CPC ..... *H10F 39/80373* (2025.01); *H10F 39/182* (2025.01); *H10F 39/8053* (2025.01); *H10F 39/8063* (2025.01); *H10F 39/807* (2025.01)

(58) Field of Classification Search
CPC ........... H10F 39/80373; H10F 39/8063; H10F 39/802; H10F 39/182; H10F 39/8053;
(Continued)

(56) References Cited

U.S. PATENT DOCUMENTS

| | | | | |
|---|---|---|---|---|
| 10,903,257 B2 * | 1/2021 | Toda | ...................... | H04N 25/76 |
| 2010/0118170 A1 * | 5/2010 | Matsumoto | ........... | H10F 39/802 257/292 |

(Continued)

FOREIGN PATENT DOCUMENTS

| | | |
|---|---|---|
| JP | 2009295937 A | 12/2009 |
| JP | 2020517099 A | 6/2020 |

(Continued)

OTHER PUBLICATIONS

Korean Office Action dated Mar. 12, 2026 for corresponding Korean Application No. 10-2022-0173445.

*Primary Examiner* — Moazzam Hossain
(74) *Attorney, Agent, or Firm* — Harness, Dickey & Pierce, P.L.C.

(57) ABSTRACT

An image sensor includes a substrate including first and second surfaces opposite to each other in a first direction; pixels each including a photoelectric conversion area in the substrate; and a transfer gate electrode overlapping the photoelectric conversion area of one pixel of the plurality of pixels in the first direction. The substrate contains impurities of a first conductivity type. The photoelectric conversion area contains impurities of a different second conductivity type. The transfer gate electrode includes first, second and third extensions extending from the first surface into the substrate and having respective a first, second, and third depths. The first depth is larger than each of the second and third depths. A bottom surface of the first extension is in the photoelectric conversion area. Each of the bottom surfaces of the second and third extensions is spaced apart from the photoelectric conversion area in the first direction.

20 Claims, 25 Drawing Sheets

(58) Field of Classification Search
CPC ...... H10F 39/807; H10F 39/014; H10F 39/18; H10F 39/8023; H10F 39/80–813
USPC .......................................................... 257/292
See application file for complete search history.

(56) References Cited

U.S. PATENT DOCUMENTS

| | | | | |
|---|---|---|---|---|
| 2016/0126278 | A1* | 5/2016 | Shimotsusa | H10F 39/80373 257/229 |
| 2019/0267429 | A1* | 8/2019 | Zhang | H10K 39/32 |
| 2021/0351223 | A1* | 11/2021 | Nomoto | H10F 39/812 |
| 2022/0199660 | A1 | 6/2022 | Lee et al. | |
| 2024/0038908 | A1* | 2/2024 | Gupta | H10F 39/103 |

FOREIGN PATENT DOCUMENTS

| | | | |
|---|---|---|---|
| JP | 2022086611 | A | 6/2022 |
| KR | 10-2011-0050351 | A | 5/2011 |
| KR | 10-2022-0030494 | A | 3/2022 |
| KR | 10-2022-0099140 | A | 7/2022 |

* cited by examiner

IMAGE SENSOR

CROSS-REFERENCE TO RELATED APPLICATION

This application claims priority from Korean Patent Application No. 10-2022-0173445 filed on Dec. 13, 2022 in the Korean Intellectual Property Office, and all the benefits accruing therefrom under 35 U.S.C. 119, the contents of which in its entirety are herein incorporated by reference.

BACKGROUND

Field

The present inventive concepts relate to image sensors.

Description of Related Art

An image senor is one of semiconductor devices that converts optical information into an electrical signal. The image sensor may include a CCD (charge-coupled device) based image sensor and a CMOS (complementary metal-oxide semiconductor) based image sensor.

The image sensor may be embodied in a form of a package. In this case, the package may be configured to have a structure that protects the image sensor and, at the same time, allows light to be incident on a photo receiving surface or a sensing area of the image sensor.

SUMMARY

A technical purpose to be achieved by the present inventive concepts is to provide an image sensor with improved reliability.

Purposes according to the present inventive concepts are not limited to the above-mentioned purpose. Other purposes and advantages according to the present inventive concepts that are not mentioned may be understood based on following descriptions, and may be more clearly understood based on embodiments according to the present inventive concepts. Further, it will be easily understood that the purposes and advantages according to the present inventive concepts may be realized using means shown in the claims or combinations thereof.

According to some example embodiments of the present inventive concepts, an image sensor may include a substrate including a first surface and a second surface opposite to each other in a first direction; a plurality of pixels, each pixel of the plurality of pixels including a photoelectric conversion area in the substrate; and a transfer gate electrode on one pixel of the plurality of pixels. The transfer gate electrode may overlap the photoelectric conversion area of the one pixel in the first direction. The substrate may contain impurities of a first conductivity type. The photoelectric conversion area may contain impurities of a second conductivity type different from the first conductivity type. The transfer gate electrode may include a first extension extending from the first surface of the substrate into the substrate, wherein the first extension has a first depth; a second extension extending from the first surface of the substrate into the substrate, wherein the second extension has a second depth; and a third extension extending from the first surface of the substrate into the substrate, wherein the third extension has a third depth. The first depth may be larger than each of the second depth and the third depth. A bottom surface of the first extension may be in the photoelectric conversion area. Each of a bottom surface of the second extension and a bottom surface of the third extension may be spaced apart from the photoelectric conversion area in the first direction.

According to some example embodiments of the present inventive concepts, an image sensor may include a substrate including a first surface and a second surface opposite to each other in a first direction; a plurality of pixels, each pixel of the plurality of pixels including a photoelectric conversion area in the substrate; and a transfer gate electrode on one pixel of the plurality of pixels, wherein the transfer gate electrode includes first to third extensions above the photoelectric conversion area of the one pixel and extending into the substrate. The substrate may contain impurities of a first conductivity type. The photoelectric conversion area may contain impurities of a second conductivity type different from the first conductivity type. A first depth of the first extension in the substrate may be larger than each of a second depth of the second extension in the substrate and a third depth of the third extension in the substrate. A spacing between the first extension and a center of the photoelectric conversion area on the first surface of the substrate may be smaller than each of a spacing between the second extension and the center of the photoelectric conversion area on the first surface of the substrate and a spacing between the third extension and the center of the photoelectric conversion area on the first surface of the substrate.

According to some example embodiments of the present inventive concepts an image sensor may include a substrate including a first surface and a second surface opposite to each other in a first direction; a plurality of pixels, each pixel of the plurality of pixels including a photoelectric conversion area in the substrate; a pixel isolation pattern in the substrate so as to define the plurality of pixels; a color filter on the second surface of the substrate; a micro lens on the color filter; a transfer gate electrode on one pixel of the plurality of pixels, wherein the transfer gate electrode overlaps the photoelectric conversion area of the one pixel in the first direction, and the transfer gate electrode includes first to third extensions extending from the first surface of the substrate into the substrate; and a floating diffusion area in the substrate, wherein the floating diffusion area is in a corner of each of the plurality of pixels. The substrate may contain impurities of a first conductivity type. The photoelectric conversion area may contain impurities of a second conductivity type different from the first conductivity type. The first extension may be adjacent to a center of the photoelectric conversion area on the first surface of the substrate. Each of the second extension and the third extension may be adjacent to the floating diffusion area. A bottom surface of the first extension may be at a center of the photoelectric conversion area in the first direction. Each of a bottom surface of the second extension and a bottom surface of the third extension may be spaced apart from the photoelectric conversion area in the first direction.

Specific details of some example embodiments are included in detailed descriptions and drawings.

BRIEF DESCRIPTION OF DRAWINGS

The above and other aspects and features of the present inventive concepts will become more apparent by describing in detail some example embodiments thereof with reference to the attached drawings, in which.

DETAILED DESCRIPTION

Figure 1:
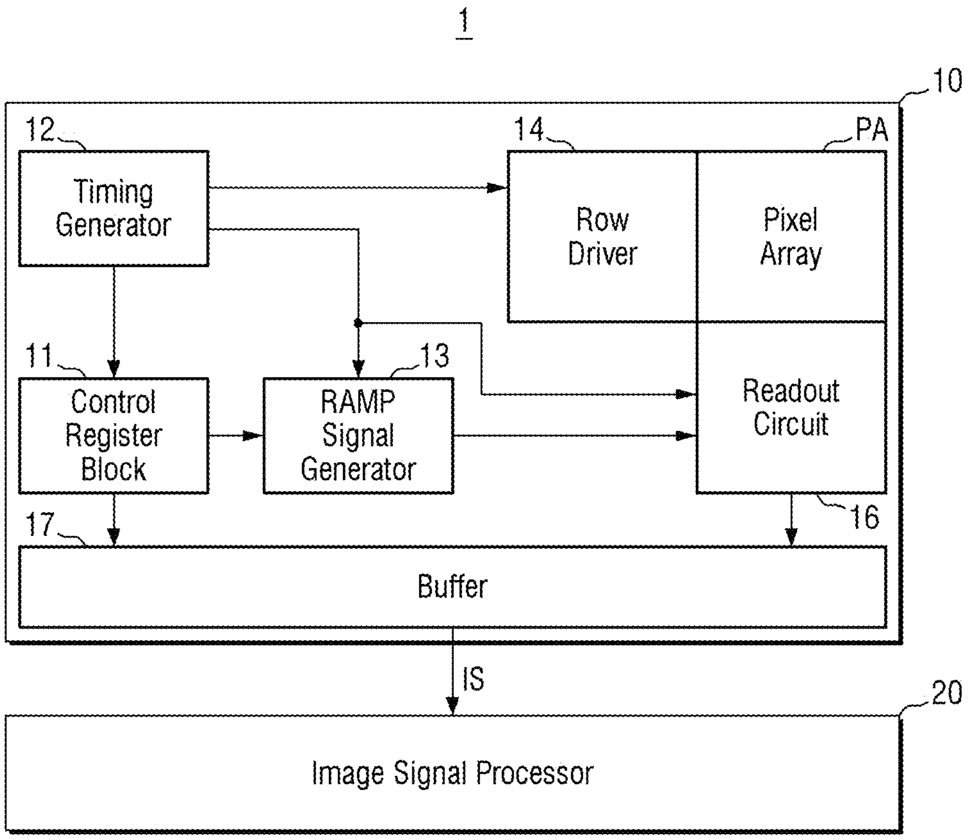
FIG. 1 is a block diagram for illustrating an image sensing device according to some example embodiments.

The present inventive concepts will be described more fully hereinafter with reference to the accompanying drawings, in which some example embodiments of the inventive concepts are shown. As those skilled in the art would realize, the described example embodiments may be modified in various different ways, all without departing from the spirit or scope of the present inventive concepts.

In order to clearly describe the present inventive concepts, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present inventive concepts are not necessarily limited to those illustrated in the drawings.

Throughout the specification, when a part is "connected" to another part, it includes not only a case where the part is "directly connected" but also a case where the part is "indirectly connected" with another part in between. In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

The use of the term "the" and similar demonstratives may correspond to both the singular and the plural. Operations constituting methods may be performed in any suitable order unless otherwise indicated herein or otherwise clearly contradicted by context and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1 is a block diagram for illustrating an image sensing device according to some example embodiments.

Referring to FIG. 1, an image sensing device 1 according to some example embodiments may include an image sensor 10 and an image signal processor 20.

The image sensor 10 may sense an image of a sensing target using light to generate an image signal IS. In some example embodiments, the generated image signal IS may be, for example, a digital signal. However, example embodiments according to the technical spirit of the present inventive concepts are not limited thereto.

The image signal IS may be provided to and processed by the image signal processor 20. The image signal processor 20 may receive the image signal IS output from a buffer 17 of the image sensor 10 and process the received image signal IS for displaying thereof.

In some example embodiments, the image signal processor 20 may perform digital binning on the image signal IS output from the image sensor 10. In this case, the image signal IS output from the image sensor 10 may be a raw image signal from a pixel array PA not subjected to analog binning, or may be the image signal IS on which analog binning has already been performed.

In some example embodiments, the image sensor 10 and the image signal processor 20 may be disposed in a separate manner from each other as illustrated. For example, the image sensor 10 may be mounted on a first chip, and the image signal processor 20 may be mounted on a second chip while the image sensor and the image signal processor may communicate with each other via a predefined interface. However, example embodiments are not limited thereto, and the image sensor 10 and the image signal processor 20 may be implemented into one package, for example, an MCP (multi-chip package).

The image sensor 10 may include a pixel array PA, a control register block 11, a timing generator 12, a row driver 14, a readout circuit 16, a ramp signal generator 13 and the buffer 17.

The control register block 11 may completely control an operation of the image sensor 10. In particular, the control register block 11 may directly transmit an operation signal to the timing generator 12, the ramp signal generator 13 and the buffer 17.

The timing generator 12 may generate a signal as a reference for an operation timing of each of various components of the image sensor 10. The operation timing reference signal generated by the timing generator 12 may be transmitted to the ramp signal generator 13, the row driver 14, the readout circuit 16, and the like.

The ramp signal generator 13 may generate a ramp signal used in the readout circuit 16 and transmit the generated ramp signal to the readout circuit. For example, the readout circuit 16 may include a correlated double sampler (CDS), a comparator, etc., and the ramp signal generator 13 may generate the ramp signal used in the correlated double sampler, the comparator, and the like and transmit the generated ramp signal thereto.

The row driver 14 may selectively activate a row of the pixel array PA.

The pixel array PA may sense an external image. The pixel array PA may include a plurality of pixels arranged two-dimensionally (for example, in a matrix form).

The readout circuit 16 may sample a pixel signal provided from the pixel array PA, compare the sampled pixel signal with the ramp signal, and may convert an analog image signal (data) into a digital image signal (data) based on the comparison result.

The buffer 17 may include, for example, a latch. The buffer 17 may temporarily store therein the image signal IS to be provided to an external component, and may transmit the image signal IS to an external memory or an external device.

As described herein, any devices, systems, units, blocks, circuits, controllers, processors, and/or portions thereof according to any of the example embodiments (including, for example, the image sensing device 1, the image sensor 10, the image signal processor 20, the pixel array PA, the control register block 11, the timing generator 12, the row driver 14, the readout circuit 16, the ramp signal generator 13, the buffer 17, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, units, blocks, circuits, controllers, processors, and/or portions thereof according to any of the example embodiments.

Figure 2:
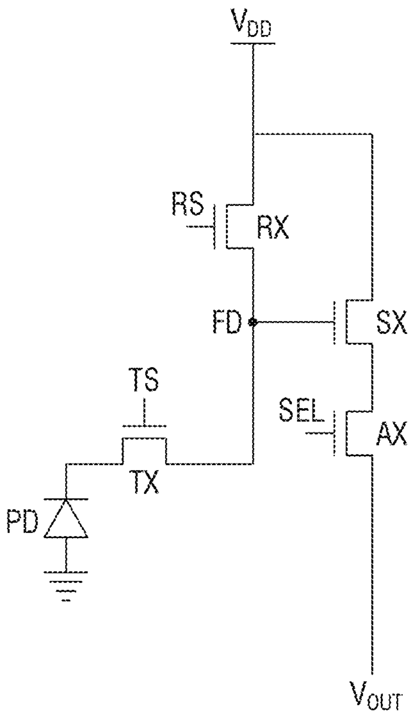
FIG. 2 is an illustrative circuit diagram for illustrating a pixel of an image sensor according to some example embodiments.

FIG. 2 is an illustrative circuit diagram for illustrating a pixel of an image sensor according to some example embodiments.

Referring to FIG. 2, each pixel may include a photoelectric conversion element PD, a transfer transistor TX, a floating diffusion area FD, a reset transistor RX, a source follower transistor SX, and a select transistor AX.

The photoelectric conversion element PD may generate electric charges in proportion to an amount of light incident from an outside. The photoelectric conversion element PD may be coupled with the transfer transistor TX that transfers the generated and accumulated charges to the floating diffusion area FD. The floating diffusion area FD may refer to an area that converts charges into voltage. Since the floating diffusion area FD has parasitic capacitance, charges may be accumulated therein.

One end of the transfer transistor TX may be connected to the photoelectric conversion element PD, and the other end of the transfer transistor TX may be connected to the floating diffusion area FD. The transfer transistor TX may be embodied as a transistor driven based on a predefined bias (for example, a transfer signal TS). That is, the transfer transistor TX may transfer the charges generated from the photoelectric conversion element PD to the floating diffusion area FD based on the transfer signal TS.

The source follower transistor SX may amplify change in an electrical potential of the floating diffusion area FD when the area FD has received the charges from the photoelectric conversion element PD, and then may output the amplified change to an output line $V_{OUT}$. When the source follower transistor SX is turned on, a predefined electrical potential (for example, a power voltage $V_{DD}$) provided to a drain of the source follower transistor SX may be transferred to a drain area of the select transistor AX.

The select transistor AX may select the pixel to be read on a row basis. The select transistor AX may be embodied as a transistor driven using a select line that applies a predefined bias (for example, a row select signal SEL).

The reset transistor RX may periodically reset the floating diffusion area FD. The reset transistor RX may be embodied as a transistor driven using a reset line that applies a predefined bias (for example, a reset signal RS).

When the reset transistor RX is tuned on based on the reset signal RS, a predefined electrical potential (for example, a power supply voltage $V_{DD}$) provided to a drain of the reset transistor RX may be transferred to the floating diffusion area FD.

Figure 3:
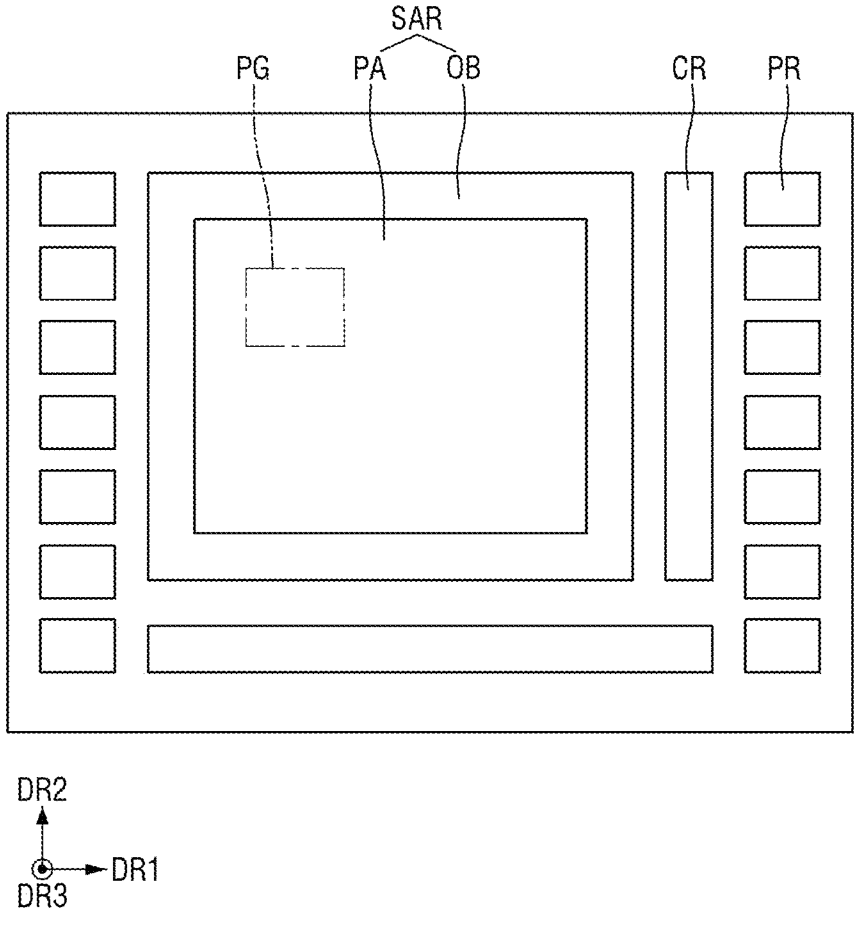
FIG. 3 is an illustrative layout diagram for illustrating an image sensor according to some example embodiments.

FIG. 3 is an illustrative layout diagram for illustrating an image sensor according to some example embodiments.

Referring to FIG. 3, the image sensor according to some example embodiments may include a sensor array area SAR, a connection area CR, and a pad area PR.

The sensor array area SAR may include an area corresponding to the pixel array PA of FIG. 1. The sensor array area SAR may include the pixel array PA and a light-blocking area OB. In the pixel array PA, active pixels for receiving light to generate an active signal may be arranged. Optical black pixels for blocking light to generate an optical black signal may be arranged in the light-blocking area OB. The light-blocking area OB may be formed around the pixel array PA in some example embodiments. However, this is merely an example. In some example embodiments, dummy pixels may be formed in a portion of the pixel array PA adjacent to the light-blocking area OB.

The connection area CR may be formed around the sensor array area SAR. The connection area CR may be formed on one side of the sensor array area SAR. However, this is merely an example. Wirings may be formed in the connection area CR to transmit/receive an electrical signal of the sensor array area SAR.

The pad area PR may be formed around the sensor array area SAR. The pad area PR may be formed adjacent to an edge of the image sensor according to some example embodiments. However, this is merely an example. The pad area PR may be connected to an external device, etc. Thus, the image sensor according to some example embodiments and an external device may transmit/receive an electrical signal therebetween via the pad area PR.

In FIG. 3, the connection area CR is illustrated to be interposed between the sensor array area SAR and the pad area PR. However, this is only illustrative. In another example, an arrangement of the sensor array area SAR, the connection area CR, and the pad area PR may vary according to need.

Figure 4:
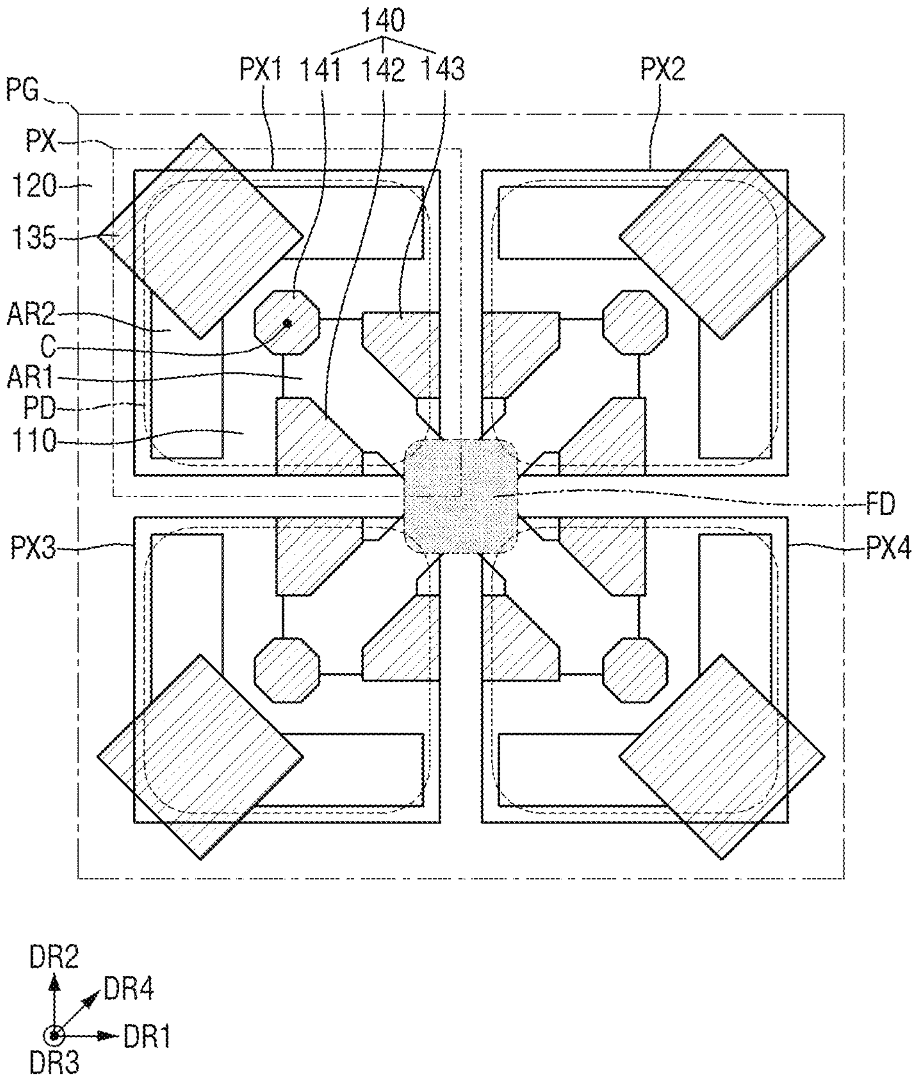
FIGS. 4 and 5 are illustrative layout diagrams for illustrating a pixel of an image sensor according to some example embodiments.
Figure 5:
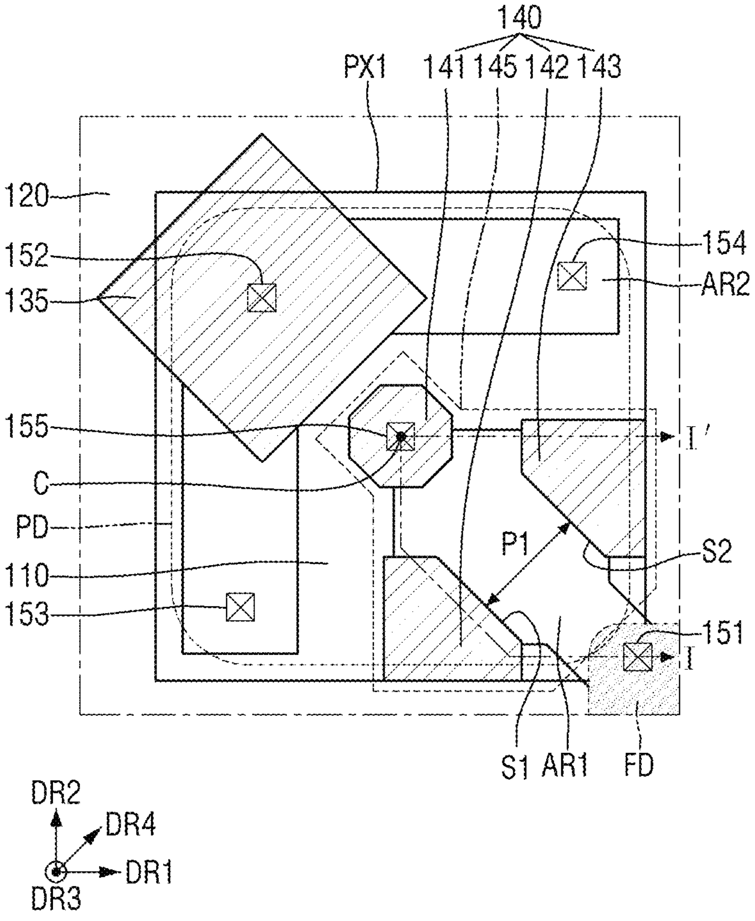
Figure 6:
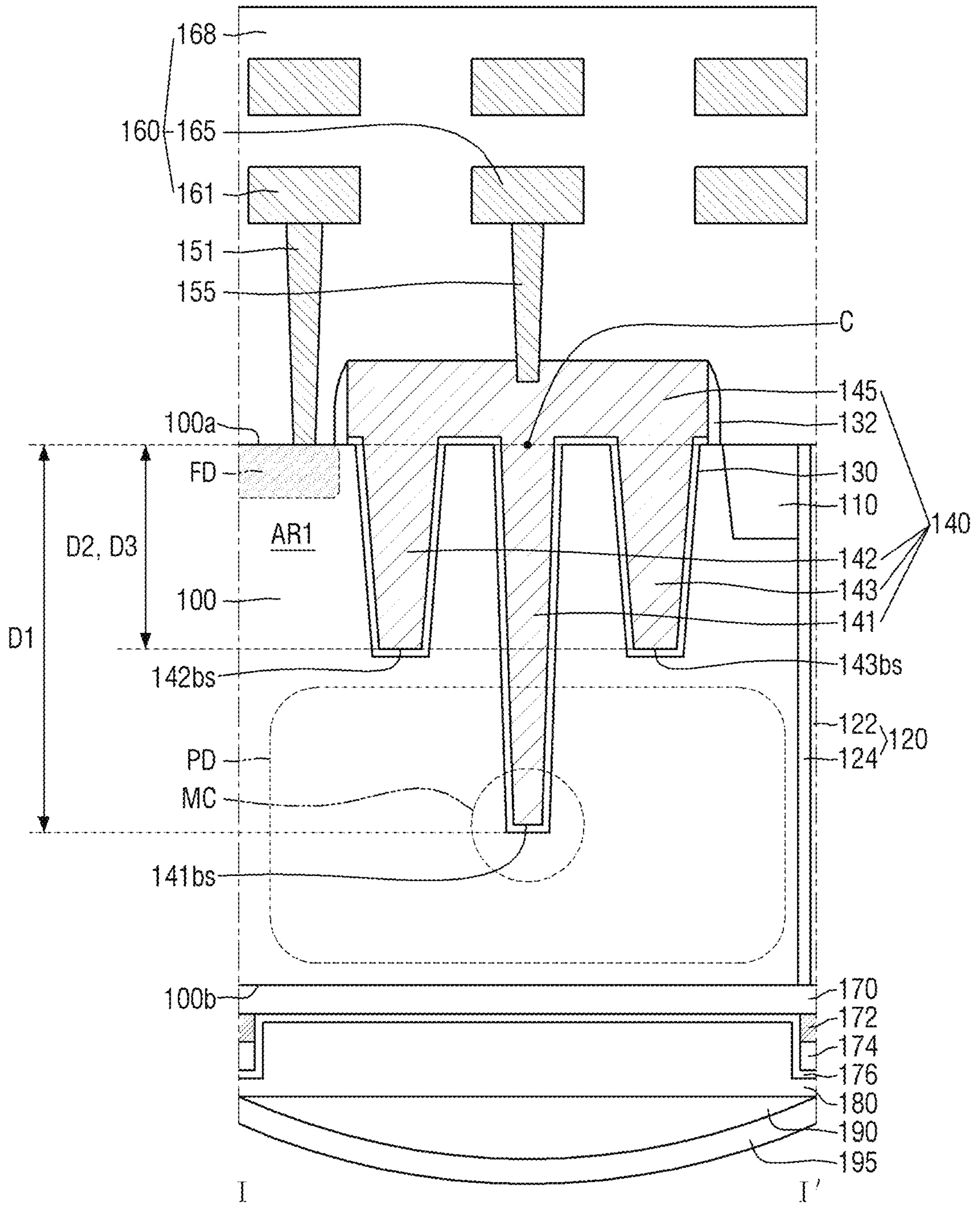
FIG. 6 and FIG. 7 are cross-sectional views taken along cross-sectional view line I-I' of FIG. 5.
Figure 7:
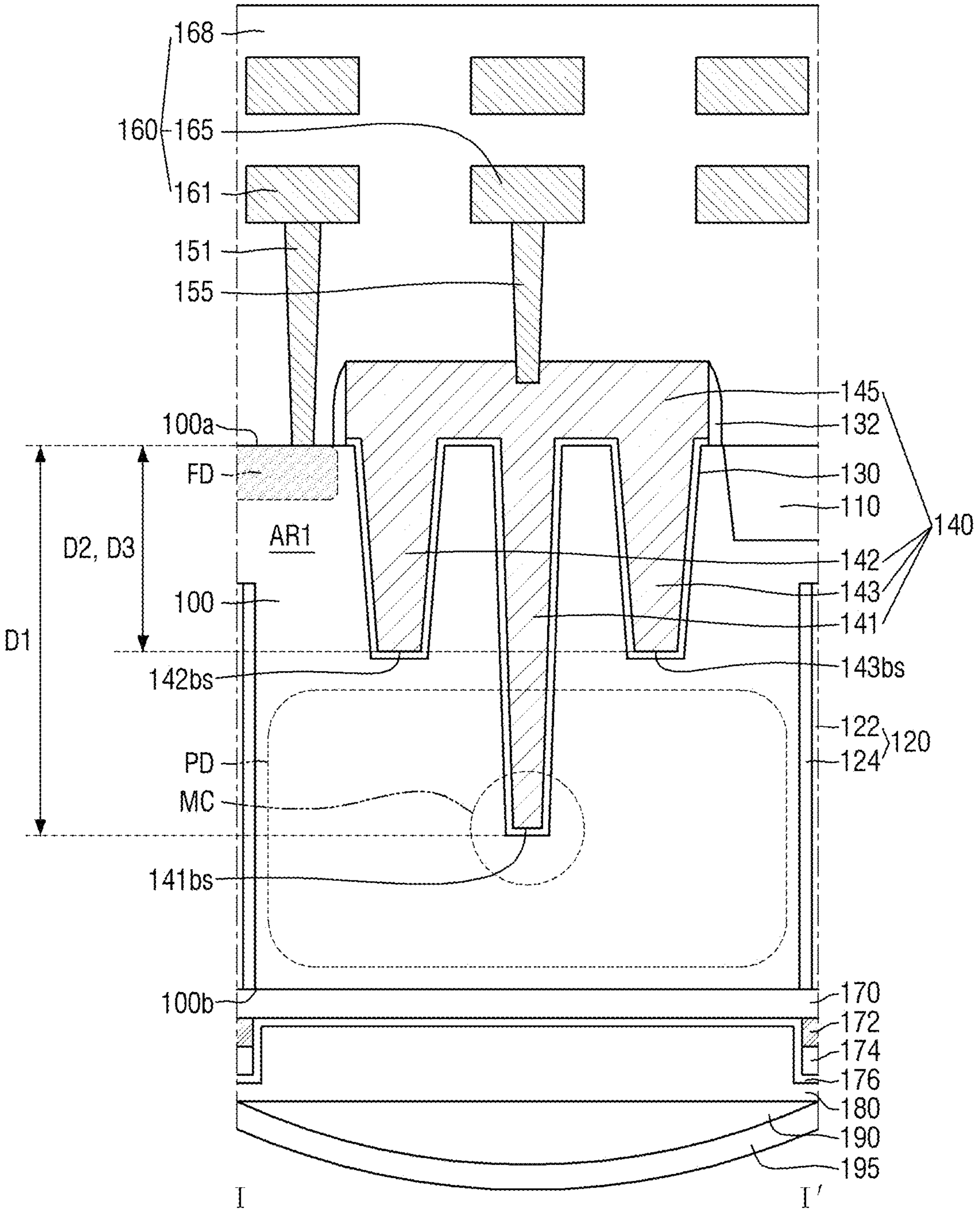

FIGS. 4 and 5 are illustrative layout diagrams for illustrating a pixel of an image sensor according to some example embodiments. FIG. 6 and FIG. 7 are cross-sectional views taken along a cross-sectional view line I-I' of FIG. 5. For reference, FIG. 4 is an enlarged view of a PG portion of FIG. 3. For reference, FIG. 5 is an enlarged view of a PX portion of FIG. 4.

Referring to FIG. 2 and FIG. 4, the image sensor according to some example embodiments may include a plurality of pixel groups PG. The pixel group PG may include, for example, first to fourth pixels PX1, PX2, PX3, and PX4 adjacent to each other. Each of the first to fourth pixels PX1, PX2, PX3, and PX4 may include one photoelectric conversion area PD.

For example, the first to fourth pixels PX1, PX2, PX3, and PX4 may be arranged in two rows and two columns. The first pixel PX1 may neighbor (e.g., be an adjacent pixel in relation to) the third pixel PX3 in a second direction DR2. The second pixel PX2 may neighbor the first pixel PX1 in a first direction DR1 and may neighbor the fourth pixel PX4 in the second direction DR2. The fourth pixel PX4 may neighbor the third pixel PX3 in the first direction DR1. Each of the first to fourth pixels PX1, PX2, PX3, and PX4 may be defined by a pixel isolation pattern 120. For example, the pixel isolation pattern 120 may surround each of the first to fourth pixels PX1, PX2, PX3, and PX4. The second direction DR2 may intersect the first direction DR1.

The pixel group PG may share one floating diffusion area FD. In some example embodiments, the first to fourth pixels PX1, PX2, PX3, and PX4 may share the floating diffusion area FD. The floating diffusion area FD may be partially disposed in a portion of each of the first to fourth pixels PX1, PX2, PX3, and PX4 while being shared by the first to fourth pixels PX1, PX2, PX3, and PX4. The floating diffusion area FD may be partially disposed in, for example, a corner of each of the first to fourth pixels PX1, PX2, PX3, and PX4. The floating diffusion area FD may be partially disposed in a first active area AR1 of each of the first to fourth pixels PX1, PX2, PX3, and PX4.

The second pixel PX2 may be symmetrical with the first pixel PX1 in the second direction DR2. The third pixel PX3 may be symmetrical with the first pixel PX1 in the first direction DR1. The fourth pixel PX4 may be symmetrical with the second pixel PX2 in the first direction DR1. The fourth pixel PX4 may be symmetrical with the third pixel PX3 in the second direction DR2. Each of the second to fourth pixels PX2, PX3, and PX4 may be similar to the first pixel PX1. Hereinafter, the first pixel PX1 will be described in detail by way of example.

Referring to FIG. 4 to FIG. 6, the image sensor according to some example embodiments may include a first substrate 100, an element isolation pattern 110, the pixel isolation pattern 120, a gate dielectric film 130, a transfer gate electrode 140, a gate spacer 132, a first wiring structure 160, a grid pattern 172 and 174, a color filter 180 and a micro lens 190.

The first substrate 100 may be embodied as a semiconductor substrate. For example, the first substrate 100 may be made of bulk silicon or an SOI (silicon-on-insulator). The first substrate 100 may be embodied as a silicon substrate, or may include a material other than silicon, such as silicon germanium, indium antimonide, lead telluride compound, indium arsenide, indium phosphide, gallium arsenide or gallium antimonide. In some example embodiments, the first substrate 100 may include a base substrate and an epitaxial layer formed on the base substrate. The first substrate 100 may include impurities of a first conductivity type. For example, the first substrate 100 may include p-type impurities (e.g., boron (B), aluminum (Al), indium (In) or gallium (Ga)). In following description, the first conductivity type may be a p-type and the second conductivity type may be an n-type.

The first substrate 100 may include a first surface 100*a* and a second surface 100*b* as opposed to each other (e.g., opposite surfaces). In some example embodiments as described below, the first surface 100*a* may be referred to as a front surface of the first substrate 100, and the second surface 100*b* may be referred to as a rear surface of the first substrate 100. In some example embodiments, the second surface 100*b* of the first substrate 100 may act as a light receiving surface on which light is incident. That is, the image sensor according to some example embodiments may be a back side-illuminated (BSI) image sensor.

The first surface 100*a* and the second surface 100*b* may be opposite to each other in a third direction DR3. In the third direction DR3, the first surface 100*a* may act as an upper surface of the first substrate 100 and the second surface 100*b* may act as a lower surface of the first substrate 100. The third direction DR3 may intersect the first direction DR1 and the second direction DR2. The first direction DR1 and the second direction DR2 may define the first surface 100*a* or the second surface 100*b* of the first substrate 100. The first direction DR1 and the second direction DR2 may each be a direction parallel to the first surface 100*a* or the second surface 100*b* of the first substrate 100. The third direction DR3 may be a direction perpendicular to the first surface 100*a* or the second surface 100*b* of the first substrate 100. The third direction DR3 may be a direction from the second surface 100*b* of the first substrate 100 toward the first surface 100*a* thereof. In following descriptions, the upper surface and the lower surface may face each other in the third direction DR3.

The photoelectric conversion area PD may be disposed in the first substrate 100 and in the first pixel PX1. The photoelectric conversion area PD may correspond to the photoelectric conversion element PD of FIG. 2. That is, the photoelectric conversion area PD may generate electric charges in proportion to an amount of light incident thereto from an outside. The photoelectric conversion area PD may contain impurities of a second conductivity type different from the first conductivity type. The photoelectric conversion area PD may be formed using an ion implantation process. For example, the photoelectric conversion area PD may be an area in the p-type first substrate 100 into which n-type impurities (for example, phosphorus (P) or arsenic (As)) are implanted using the ion implantation process.

A position of the photoelectric conversion area PD in the first substrate 100, that is, a position of the photoelectric conversion area PD between the first surface 100*a* and the second surface 100*b* of the first substrate 100 may vary depending on an ion implantation process condition. In the ion implantation process, a doping depth of impurity ions may be set. Initially implanted impurity ions may be present at a high concentration in a small space at a set doping depth in the first substrate 100. The implanted impurity ions may diffuse from the same space to a surrounding area at a low doping concentration. Under absence of other constraints, a diffusion direction of the impurity ions may be any direction in a three-dimensional space. As the diffusion proceeds, a volume of the photoelectric conversion area PD may increase, while an impurity ion concentration per unit volume may decrease. For example, a concentration of the impurity ions in the photoelectric conversion area PD may decrease as the photoelectric conversion area PD extends away from the initially implanted area. A maximum impurity concentration area MC in the photoelectric conversion area PD may be an area corresponding to the set doping depth. However, the present inventive concepts are not limited thereto, and an impurity concentration distribution in the photoelectric conversion area PD where the diffusion has been completed may vary depending on a diffusion condition, differences between constituent materials of areas of the first substrate 100, presence or absence of other impurities therein, and a geometric shape of the first substrate 100. Further, doping depths of the impurity ions respectively in the pixels PX1, PX2, PX3, and PX4 may be set to be equal to each other or may be set to be different from each other.

The impurity concentration may tend to be proportional to an electric potential applied to the photoelectric conversion area PD. For example, an area with a high impurity concentration may have a relatively high electric potential, and an area with a low impurity concentration may have a relatively low electric potential. An amount of the electric charges which the photoelectric conversion area PD may generate and/or accumulate may be proportional to the electric potential. Therefore, the maximum impurity concentration area MC of the photoelectric conversion area PD may be an area that generates and/or accumulates the electric charges at a maximum level.

For example, the maximum impurity concentration area MC of the photoelectric conversion area PD may be positioned at a center in each of the first to third directions DR1, DR2, and DR3 of the photoelectric conversion area PD. The maximum impurity concentration area MC of the photoelectric conversion area PD may be disposed at a center in the third direction DR3 of the photoelectric conversion area PD in the first substrate 100. A center of the photoelectric conversion area PD on the first surface 100*a* of the first substrate 100, shown as center C, may overlap with the maximum impurity concentration area MC of the photoelectric conversion area PD in the third direction DR3.

The first pixel PX1 may include the first active area AR1 and a second active area AR2. The first active area AR1 and the second active area AR2 may be disposed in the first substrate 100. Each of the first active area AR1 and the second active area AR2 may extend from the first surface 100*a* of the first substrate 100 into the first substrate 100. The first active area AR1 and the second active area AR2 may be spaced apart from each other. The first active area AR1 and the second active area AR2 may be isolated from each other via the element isolation pattern 110.

The element isolation pattern 110 may be disposed in the first substrate 100. The element isolation pattern 110 may extend from the first surface 100*a* of the first substrate 100 into the first substrate 100. The element isolation pattern 110 may extend from the first surface 100*a* of the first substrate 100 toward the second surface 100*b* of the first substrate 100. For example, the element isolation pattern 110 may be formed by filling an insulating material in a shallow trench formed by patterning a portion of the first substrate 100 including the first surface 100*a*. The element isolation pattern 110 may surround the first active area AR1 and the second active area AR2. The element isolation pattern 110 may define each of the first active area AR1 and the second active area AR2. The element isolation pattern 110 may include, for example, at least one of silicon oxide, silicon nitride, silicon oxynitride, or combinations thereof.

The pixel isolation pattern 120 may be disposed in the first substrate 100. The pixel isolation pattern 120 may define each of a plurality of pixels in the first substrate 100. The pixel isolation pattern 120 may extend from the first surface 100*a* of the first substrate 100 into the first substrate 100. The pixel isolation pattern 120 may be formed, for example, by filling an insulating material in a deep trench formed by patterning a portion of the first substrate 100.

It is shown that a width of the pixel isolation pattern 120 is constant in the thickness direction. However, this is only an example. For example, the width of the pixel isolation pattern 120 may decrease as the pixel isolation pattern 120 extends toward the second surface 100*b* of the first substrate 100. In another example, the width of the pixel isolation pattern 120 may increase as the pixel isolation pattern 120 extends toward the second surface 100*b* of the first substrate 100.

In the image sensor according to some example embodiments, the pixel isolation pattern 120 may extend from the first surface 100*a* of the first substrate 100 toward the second surface 100*b* of the first substrate 100. The pixel isolation pattern 120 may extend through an entirety of the first substrate 100. An upper surface of the pixel isolation pattern 120 may be coplanar with the first surface 100*a* of the first substrate 100 while a lower surface of the pixel isolation pattern 120 may be coplanar with the second surface 100*b* of the first substrate 100.

In the image sensor according to some example embodiments, the pixel isolation pattern 120 may surround the first pixel PX1 except for the floating diffusion area FD. The pixel isolation pattern 120 may surround at least a portion of the floating diffusion area FD of the first pixel PX1. The pixel isolation pattern 120 may not overlap with the floating diffusion area FD in the third direction DR3.

The pixel isolation pattern 120 may include a filling pattern 122 and a spacer film 124. The filling pattern 122 may extend from the lower surface of the element isolation pattern 110 toward the second surface 100*b* of the first substrate 100. The filling pattern 122 may include a conductive material, for example, polysilicon (poly Si). However, the present inventive concepts are not limited thereto. The spacer film 124 may extend along a side surface of the filling pattern 122. The spacer film 124 may include at least one of an insulating material, for example, silicon oxide, aluminum oxide, tantalum oxide, or combinations thereof. However, the present inventive concepts are not limited thereto. The spacer film 124 may be interposed between the filling pattern 122 and the first substrate 100 so as to electrically isolate the filling pattern 122 and the first substrate 100 from each other.

The floating diffusion area FD may be disposed in the first substrate 100. The floating diffusion area FD may be disposed in an active area defined by the element isolation pattern 110. The floating diffusion area FD may be formed, for example, by doping n-type impurities into the p-type first substrate 100.

A transfer gate electrode 140 may be disposed on the first surface 100*a* of the first substrate 100. The transfer gate electrode 140 may be disposed on the first substrate 100 and between the photoelectric conversion area PD and the floating diffusion area FD. The transfer gate electrode 140 may be disposed on the first active area AR1. The transfer gate electrode 140 may be disposed on the photoelectric conversion area PD. The transfer gate electrode 140 may be a vertical transfer gate. That is, at least a portion of the transfer gate electrode 140 may be buried in the first substrate 100.

The transfer gate electrode 140 may correspond to a gate electrode of the transfer transistor (e.g., TX in FIG. 2). For example, when the transfer transistor is turned on, the electric charges generated from the photoelectric conversion area PD may be transferred to the floating diffusion area FD.

In the image sensor according to some example embodiments, the transfer gate electrode 140 may include first to third extensions 141, 142, and 143 and a connection portion 145.

The first extension 141 may be adjacent to a center C of the photoelectric conversion area PD on the first surface 100*a* of the first substrate 100. That is, the center C of the photoelectric conversion area PD may be a center of the first substrate 100 in a plane including the first direction DR1 and the second direction DR2. On the first surface 100*a* of the first substrate 100, the first extension 141 may be closer to the center C of the photoelectric conversion area PD (e.g., in one or more directions extending parallel to the first surface 100*a* of the first substrate 100) than each of the second extension 142 and the third extension 143.

Each of the second extension 142 and the third extension 143 may be adjacent to the floating diffusion area FD. On the first surface 100*a* of the first substrate 100, each of the second extension 142 and the third extension 143 may be closer to the floating diffusion area FD than the first extension 141. A portion of the floating diffusion area FD may be disposed in the first substrate 100 and between the second extension 142 and the third extension 143.

The second extension 142 may include a first sidewall S1. The third extension 143 may include a second sidewall S2 facing the first sidewall S1. The second sidewall S2 may face the first sidewall S1 in a fourth direction DR4. The fourth direction DR4 may be a direction between the first direction DR1 and the second direction DR2.

In the image sensor according to some example embodiments, a distance P1 between the first sidewall S1 of the second extension 142 and the second sidewall S2 of the third extension 143 may be constant along each of the first sidewall S1 of the second extension 142 and the second sidewall S2 of the third extension 143. The first sidewall S1 of the second extension 142 and the second sidewall S2 of the third extension 143 may be parallel with each other.

In the image sensor according to some example embodiments, an area size of the first extension 141 on the first surface 100*a* of the first substrate 100 may be larger than each of an area size of the second extension 142 and an area size of the third extension 143 on the first surface 100*a* of the first substrate 100. In the image sensor according to some example embodiments, the area size of the first extension 141 on the first surface 100*a* of the first substrate 100 may be smaller than or equal to each of the area size of the second extension 142 and the area size of the third extension 143 on the first surface 100*a* of the first substrate 100.

Each of the first to third extensions 141, 142, and 143 may extend from the first surface 100*a* of the first substrate 100 into the first substrate 100. The first extension 141 may have a first depth D1 in the first substrate 100. A distance from the first surface 100*a* of the first substrate 100 to a bottom surface 141*bs* of the first extension 141 (e.g., in the third direction DR3 which extends perpendicular to the first surface 100*a* of the first substrate 100) may be the first depth D1. The second extension 142 may have a second depth D2 in the first substrate 100. A distance from the first surface 100*a* of the first substrate 100 to a bottom surface 142*bs* of the second extension 142 (e.g., in the third direction DR3 which extends perpendicular to the first surface 100*a* of the first substrate 100) may be the second depth D2. The third extension 143 may have a third depth D3 in the first substrate 100. A distance from the first surface 100*a* of the first substrate 100 to a bottom surface 143*bs* of the third extension 143 (e.g., in the third direction DR3 which extends perpendicular to the first surface 100*a* of the first substrate 100) may be the third depth D3. The first depth D1 may be greater than each of the second depth D2 and the third depth D3. In some example embodiments, the second depth D2 may be equal to the third depth D3.

The bottom surface 141*bs* of the first extension 141 may be disposed in the photoelectric conversion area PD. That is, a lower portion of the first extension 141 may be disposed in the photoelectric conversion area PD. The bottom surface 141*bs* of the first extension 141 may be disposed in the maximum impurity concentration area MC of the photoelectric conversion area PD. The first extension 141 may be positioned at a center in the third direction DR3 of the photoelectric conversion area PD. Each of the bottom surface 142*bs* of the second extension 142 and the bottom surface 143*bs* of the third extension 143 may be spaced apart from the photoelectric conversion area PD in the third direction DR3. The bottom surface 143*bs* of the third extension 143 may be spaced from the photoelectric conversion area PD in the third direction DR3. That is, the second extension 142 and the third extension 143 may not be disposed in the photoelectric conversion area PD.

The electric charges generated in the photoelectric conversion area PD are transferred to the floating diffusion area FD via the transfer transistor TX. As a distance between the electric charges to be transferred and the transfer gate electrode 140 increases, transfer efficiency of the transfer transistor TX may decrease. In the image sensor according to some example embodiments, the first extension 141 of the transfer gate electrode 140 is disposed in the maximum impurity concentration area MC of the photoelectric conversion area PD, such that transfer efficiency of the transfer transistor TX may be improved and/or increased. Further, in the image sensor according to some example embodiments, the electric charges transferred from the photoelectric conversion area PD to the transfer transistor TX via the first extension 141 may be transferred to the floating diffusion area FD from the transfer transistor TX via the second extension 142 and the third extension 143. Thus, transfer efficiency of the electric charges may be improved and/or increased. Further, FWC (full well capacity) of the transfer transistor TX may be increased. As a result, an operational performance and/or reliability of an image sensor and any image sensing device including same may be improved based on a transfer gate electrode 140 that is on a given pixel (e.g., the first pixel PX1) having first to third extensions 141 to 143 extending into the substrate to respective spaced-apart bottom surfaces 141*bs* to 143*bs* at respective first to third depths D1 to D3, where the first depth D1 is greater (e.g., larger) than each of the second depth D2 and the third depth D3 and is in the photoelectric conversion area PD while the second and third depths D2 and D3 are spaced apart from the photoelectric conversion area PD, so as to be configured to facilitate improved transfer efficiency of electric charges from the photoelectric conversion area PD to the transfer transistor via the first extension 141 and further from the transfer transistor TX to the floating diffusion area FD via the second extension 142 and/or the third extension 143.

The transfer gate electrode 140 may be formed by a process of forming a trench from the first surface 100*a* of the first substrate 100 and then filling the trench with a conductive material. In this process, an interfacial defect (such as a dangling bond) may occur on the first surface 100*a* of the first substrate 100. Probability of occurrence of the interfacial defect may increase as a deeper trench is formed. Accordingly, a problem may occur in the floating diffusion area FD.

However, in the image sensor according to some example embodiments, each of the second extension 142 having the second depth D2 and the third extension 143 having the third depth D3 may be closer to the floating diffusion area FD than the first extension 141 having the first depth D1, such that probability that the problem (e.g., interfacial defects in the trenches in which the second and third extensions 142 and 143 are formed) may occur in the floating diffusion area FD may be reduced, minimized, or prevented, and thus, FPN (fixed pattern noise) of the first pixel PX1 may be reduced, minimized, or prevented. As a result, an operational performance and/or reliability of an image sensor and any image sensing device including same may be improved based on a transfer gate electrode 140 that is on a given pixel (e.g., the first pixel PX1) having first to third extensions 141 to 143 extending into the substrate to respective spaced-apart bottom surfaces 141*bs* to 143*bs* at respective first to third depths D1 to D3, where the first depth D1 is greater (e.g., larger) than each of the second depth D2 and the third depth D3 and is in the photoelectric conversion area PD while the second and third depths D2 and D3 are spaced apart from the photoelectric conversion area PD, so as to be configured to reduce, minimize, or prevent the probability of FPN in the pixel due to reduced probability of interfacial defects in the trenches in which the second and third extensions 142 and 143 are formed.

The connection portion 145 may be disposed on the first surface 100*a* of the first substrate 100. The connection portion 145 may be disposed on the first to third extensions 141, 142, and 143. In some example embodiments, the connection portion 145 and the first to third extensions 141, 142, and 143 may be separate portions of a single, unitary piece of material. The connection portion 145 may extend along the first surface 100*a* of the first substrate 100 and may be connected to the first to third extensions 141, 142, and 143. A shape of the connection portion 145 on the first surface 100*a* of the first substrate 100 may vary.

The transfer gate electrode 140 may include at least one of, for example, polysilicon doped with impurities, metal silicide such as cobalt silicide, metal nitride such as titanium nitride, or metal such as tungsten, copper, and/or aluminum. However, the present inventive concepts are not limited thereto.

The gate dielectric layer 130 may be interposed between the transfer gate electrode 140 and the first substrate 100. The transfer gate electrode 140 may be disposed on the gate dielectric layer 130. The gate dielectric layer 130 may include, for example, at least one of silicon oxide, silicon oxynitride, silicon nitride, or a high-k material having a higher dielectric constant than that of silicon oxide.

The gate spacer 132 may be disposed on the transfer gate electrode 140. The gate spacer 132 may be disposed on a sidewall of the transfer gate electrode 140 and on a sidewall of the gate dielectric layer 130. The gate spacer 132 may include, for example, at least one of silicon oxide, silicon nitride, silicon oxynitride, or combinations thereof. However, the present inventive concepts are not limited thereto. A gate electrode 135 may be disposed on the first surface 100*a* of the first substrate 100. The gate electrode 135 may be disposed on the second active area AR2. The gate electrode 135 may be a planar gate. For example, a lower surface of the gate electrode 135 may extend along the first surface 100*a* of the first substrate 100.

The gate electrode 135 may correspond to one of a gate electrode of the reset transistor (e.g., RX in FIG. 2), a gate electrode of the source follower transistor (e.g., SX in FIG. 2), or a gate electrode of the select transistor (e.g., AX in FIG. 2).

It is shown that only one gate electrode 135 is disposed in the first pixel PX1. However, this is only an example, and a plurality of operating gate electrodes having different functions may be disposed in the first pixel PX1. For example, in the first pixel PX1, at least two of the gate electrode of the reset transistor (e.g., RX in FIG. 2), the gate electrode of the source follower transistor (e.g., SX in FIG. 2), or the gate electrode of the select transistor (e.g., AX in FIG. 2) may be disposed.

A first wiring structure 160 may be formed on the first surface 100*a* of the first substrate 100. The first wiring structure 160 may include a plurality of wiring patterns. For example, the first wiring structure 160 may include a first inter-wiring insulating film 168 on the first surface 100*a* and first wiring patterns 161 and 165 disposed in the first inter-wiring insulating film 168. In FIG. 6, the number of layers of and an arrangement of the first wiring patterns 161 and 165 are only examples. The present inventive concepts are not limited thereto. The first wiring structure 160 may be electrically connected to the first and second active areas AR1 and AR2, the transfer gate electrode 140, and the gate electrode 135.

Source/drain contacts 151, 153, and 154 and gate contacts 152 and 155 may be disposed in the first inter-wiring insulating film 168. The source/drain contact 151 may connect the floating diffusion area FD and the first wiring pattern 161 to each other. The source/drain contacts 153 and 154 may connect the second active area AR2 and the first wiring pattern 161 to each other. The gate contact 152 may connect the gate electrode 135 and the first wiring pattern 161 to each other. The first wiring pattern 161 of the first wiring structure 160 may include a plurality of different wiring patterns. The first wiring patterns 161 respectively connected to the source/drain contacts 151, 153, and 154 and to the gate contact 152 may be different wiring patterns.

The gate contact 155 may be disposed on the connection portion 145 of the transfer gate electrode 140. The gate contact 155 may contact the connection portion 145 of the transfer gate electrode 140. The gate contact 155 may connect the connection portion 145 of the transfer gate electrode 140 and the first wiring pattern 165 to each other. The transfer gate electrode 140 may receive a transfer signal (for example, the transfer signal TS of FIG. 2) via the first wiring pattern 165 and the gate contact 155. That is, the first to third extensions 141, 142, and 143 may receive the same transfer signal.

A surface insulating film 170 may be disposed on the second surface 100*b* of the first substrate 100. The surface insulating film 170 may extend along the second surface 100*b* of the first substrate 100. The surface insulating film 170 may include an insulating material, for example, at least one of silicon oxide, silicon nitride, silicon oxynitride, aluminum oxide, hafnium oxide, or combinations thereof. However, the present inventive concepts are not limited thereto.

The color filter 180 may be disposed on the surface insulating film 170. The color filter 180 may be positioned to correspond to each pixel (e.g., the first pixel PX1). That is, a plurality of color filters 180 may be arranged two-dimensionally (e.g., in a matrix form) in a plane including the first direction DR1 and the second direction DR2. The color filters 180 may have various colors depending on pixels (e.g., the first pixel PX1). For example, the color filters 180 may include a red color filter, a green color filter, a blue color filter, a yellow color filter, a magenta color filter, and a cyan color filter, and may further include a white filter.

The grid pattern 172 and 174 may be disposed on the surface insulating film 170. The grid pattern 172 and 174 may be formed in a grid manner in a plan view and may be interposed between the color filters 180. The grid pattern 172 and 174 may include a metal pattern 172 and a low refractive index pattern 174. The metal pattern 172 and the low refractive index pattern 174 may be sequentially stacked on, for example, the surface insulating film 170.

The metal pattern 172 may include, for example, at least one of titanium (Ti), titanium nitride (TiN), tantalum (Ta), tantalum nitride (TaN), tungsten (W), aluminum (Al), copper (Cu), or combinations thereof. However, the present inventive concepts are not limited thereto.

The low refractive index pattern 174 may include a low refractive index material having a lower refractive index than that of silicon (Si). For example, the low refractive index pattern 174 may include at least one of silicon oxide, aluminum oxide, tantalum oxide, or combinations thereof. However, the present inventive concepts are not limited thereto.

A first protective film 176 may be disposed on the surface insulating film 170 and the grid pattern 172 and 174. For example, the first protective film 176 may conformally extend along a profile of each of the surface insulating film 170 and the grid pattern 172 and 174. The first protective film 176 may include, for example, aluminum oxide. However, the present inventive concepts are not limited thereto.

The micro lens 190 may be formed on the color filter 180. The micro lens 190 may be positioned so as to correspond to each pixel (e.g., the first pixel PX1). For example, a plurality of micro lenses 190 may be arranged two-dimensionally (e.g., in a matrix form) in the plane including the first direction DR1 and the second direction DR2.

The micro lens 190 may have a convex shape and may have a predetermined radius of curvature. Accordingly, the micro lens 190 may condense light to be incident on the photoelectric conversion area PD. The micro lens 190 may include, for example, a light-transmissive resin. However, the present inventive concepts are not limited thereto.

A second protective film 195 may be formed on the micro lens 190. The second protective film 195 may extend along a surface of the micro lens 190. The second protective film 195 may include, for example, an inorganic oxide film. For example, the second protective film 195 may include at least one of silicon oxide, titanium oxide, zirconium oxide, hafnium oxide, or combinations thereof. However, the present inventive concepts are not limited thereto. For example, the second protective film 195 may include low temperature oxide (LTO).

Referring to FIG. 7, in the image sensor according to some example embodiments, the pixel isolation pattern 120 may extend from the second surface 100*b* of the first substrate 100 toward the first surface 100*a* of the first substrate 100. An upper surface of the pixel isolation pattern 120 may be located in the first substrate 100, and a lower surface of the pixel isolation pattern 120 may be coplanar with the second surface 100*b* of the first substrate 100.

In the image sensor according to some example embodiments, the pixel isolation pattern 120 may entirely surround the first pixel PX1 (e.g., in a horizontal plane extending parallel to the first surface 100*a* of the first substrate 100). The pixel isolation pattern 120 may overlap with the floating diffusion area FD in the third direction DR3. The pixel isolation pattern 120 may be spaced apart from a floating diffusion area FD in the third direction DR3.

Figure 8:
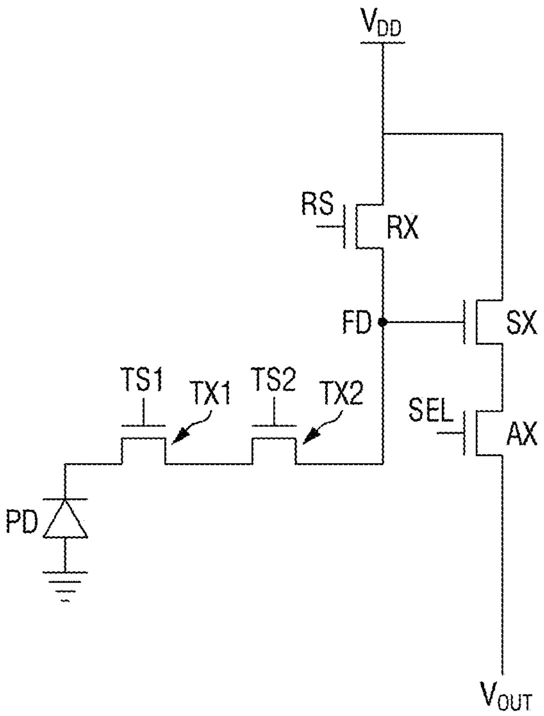
FIG. 8 is an illustrative circuit diagram for illustrating a pixel of an image sensor according to some example embodiments.
Figure 9:
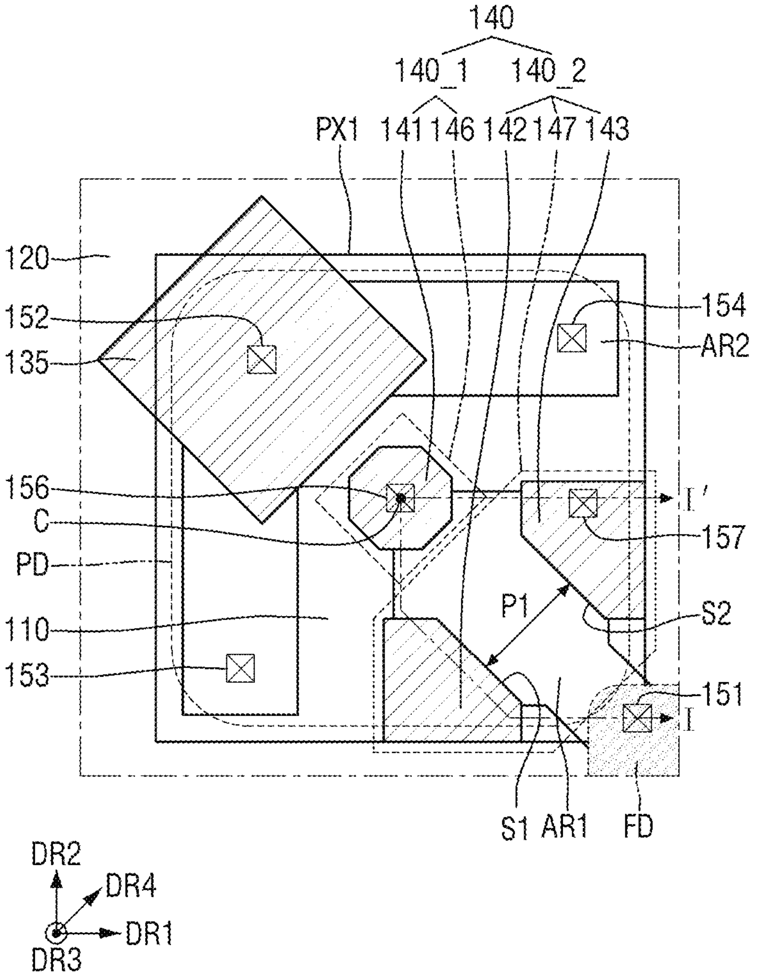
FIG. 9 is an illustrative layout diagram for illustrating a pixel of an image sensor according to some example embodiments.
Figure 10:
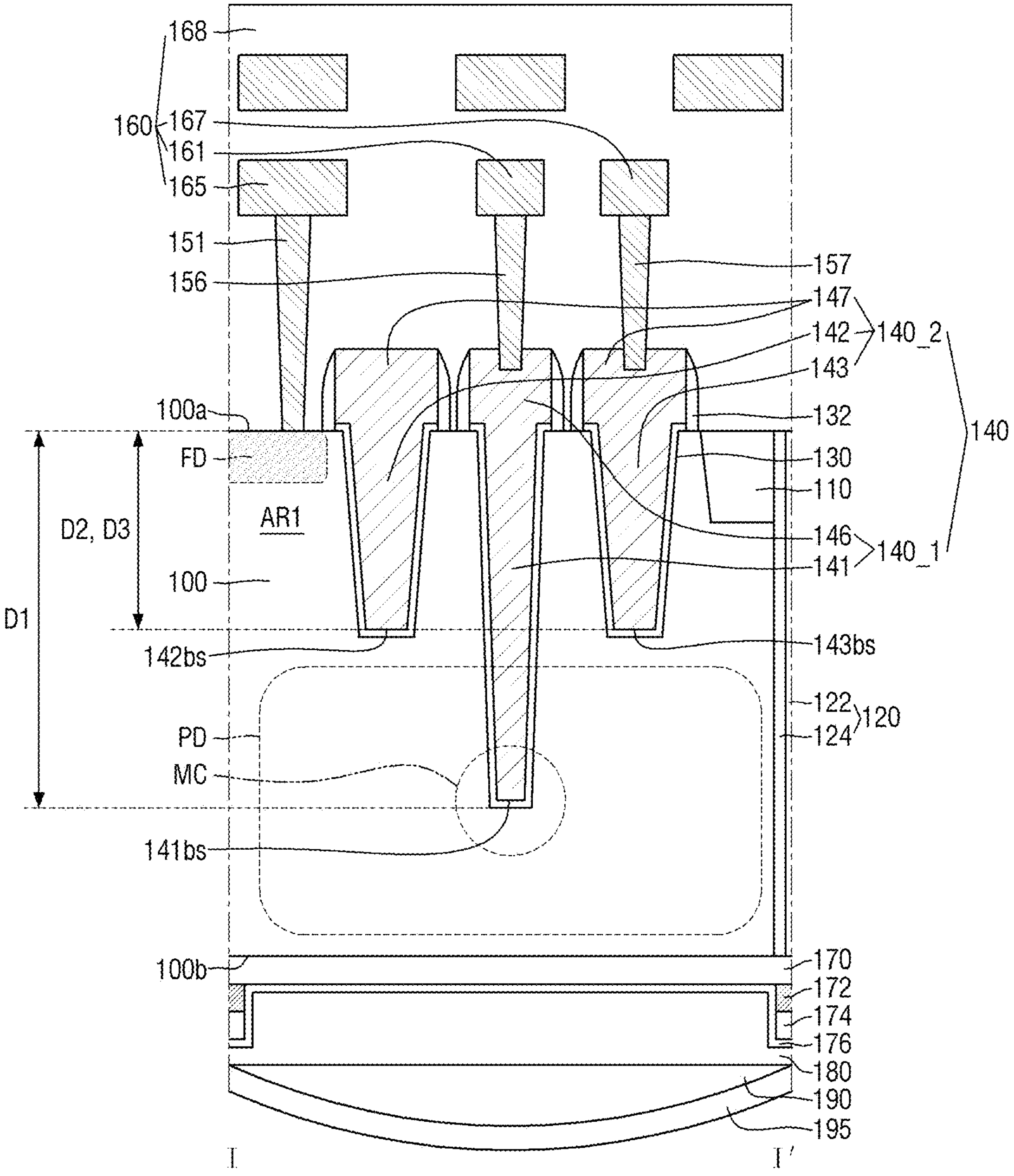
FIG. 10 is a cross-sectional view taken along cross-sectional view line I-I' of FIG. 9.
Figure 11:
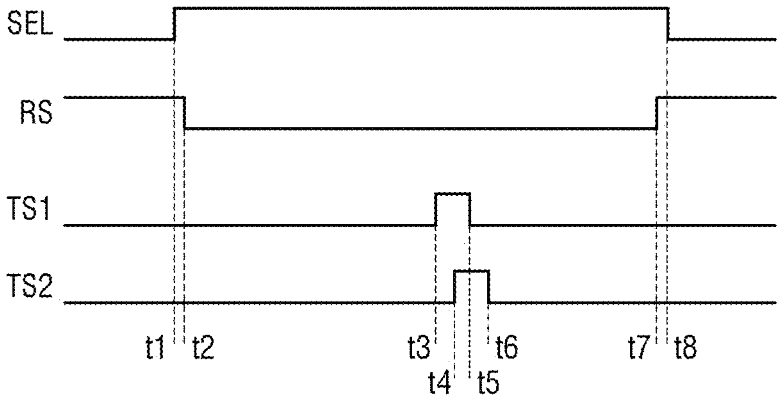
FIG. 11 is an illustrative timing diagram for illustrating an operation of an image sensor according to some example embodiments.

FIG. 8 is an illustrative circuit diagram for illustrating a pixel of an image sensor according to some example embodiments. FIG. 9 is an illustrative layout diagram for illustrating a pixel of an image sensor according to some example embodiments. FIG. 10 is a cross-sectional view taken along cross-sectional view line I-I' of FIG. 9. FIG. 11 is an illustrative timing diagram for illustrating an operation of an image sensor according to some example embodiments. For convenience of description, differences thereof from the descriptions as set forth above with reference to FIG. 1 to FIG. 7 will be described.

Referring to FIG. 8 to FIG. 10, in the image sensor according to some example embodiments, the first pixel PX1 may include a first transfer transistor TX1 and a second transfer transistor TX2. The first transfer transistor TX1 may operate based on a first transfer signal TS1 and the second transfer transistor TX2 may operate based on a second transfer signal TS2. For example, the first and second transfer transistors TX1 and TX2 may be connected in series with and disposed between the photoelectric conversion element PD and the floating diffusion area FD. The first transfer transistor TX1 may be connected to and disposed between the photoelectric conversion element PD and the second transfer transistor TX2. The second transfer transistor TX2 may be disposed between and connected to the first transfer transistor TX1 and the floating diffusion area FD.

In the image sensor according to some example embodiments, the transfer gate electrode 140 may include a first transfer gate electrode 140_1 and a second transfer gate electrode 140_2. The first transfer gate electrode 140_1 may correspond to a gate electrode of the first transfer transistor TX1, and the second transfer gate electrode 1402 may correspond to a gate electrode of the second transfer transistor TX2.

The first transfer gate electrode 140_1 may include the first extension 141 and a first connection portion 146. The second transfer gate electrode 1402 may include the second extension 142, the third extension 143, and a second connection portion 147. The transfer gate electrode 140 may include the first to third extensions 141, 142, and 143 and the first and second connection portions 146 and 147.

The first connection portion 146 may be disposed on the first surface 100*a* of the first substrate 100. The first connection portion 146 may be disposed on the first extension 141. The first connection portion 146 may extend along the first surface 100*a* of the first substrate 100 and be connected to the first extension 141. The second connection portion 147 may be disposed on the first surface 100*a* of the first substrate 100. The second connection portion 147 may be disposed on the second and third extensions 142 and 143. The second connection portion 147 may extend along the first surface 100*a* of the first substrate 100 and be connected to the second and the third extensions 142 and 143. A shape of each of the first connection portion 146 and the second connection portion 147 on the first surface 100*a* of the first substrate 100 may vary.

On the first surface 100*a* of the first substrate 100, the second transfer gate electrode 1402 may be closer to the floating diffusion area FD than the first transfer gate electrode 140_1. The first transfer gate electrode 140_1 may be disposed at a center C of the photoelectric conversion area PD on the first surface 100*a* of the first substrate 100.

A first gate contact 156 and a second gate contact 157 may be disposed in the first inter-wiring insulating film 168. The first gate contact 156 may be disposed on the first connection portion 146. The first gate contact 156 may contact the first connection portion 146. The first gate contact 156 may be connected to the first connection portion 146 and the first wiring pattern 161. The second gate contact 157 may be disposed on the second connection portion 147. The second gate contact 157 may contact the second connection portion 147. The second gate contact 157 may be connected to the second connection portion 147 and a first wiring pattern 167.

The first wiring structure 160 may include the first inter-wiring insulating film 168 and the first wiring patterns 161, 165, and 167 disposed in the first inter-wiring insulating film 168. The first wiring structure 160 may be electrically connected to the first connection portion 146 via the first gate contact 156 and electrically connected to the second connection portion 147 via the second gate contact 157.

For example, the first transfer transistor TX1 and the second transfer transistor TX2 may operate based on different transfer signals TS1 and TS2, respectively. The first connection portion 146 may receive the first transfer signal TS1 via the first wiring pattern 161 and the first gate contact 156. The second connection portion 147 may receive the second transfer signal TS2 via the first wiring pattern 167 and the second gate contact 157. The first extension 141 having the first depth D1, the second extension 142 having the second depth D2, and the third extension 143 having the third depth D3 may receive different transfer signals TS1 and TS2.

Referring to FIGS. 8 to 11, a row selection signal SEL may transition from a low level to a high level at a first time point t1 and from a high level to a low level at an eighth time point t8. The select transistor AX may be turned on based on the row select signal SEL having a high level. The low level may be referred to as a first logic level and the high level may be referred to as a second logic level.

The reset transistor RX may be turned on based on the reset signal RS having a high level, such that the floating diffusion area FD may be reset. For example, an electric potential of the floating diffusion area FD may be reset to a power supply voltage $V_{DD}$. At the second point in time t2, the reset signal RS may transition from a high level to a low level, and thus, the reset transistor RX may be turned off. At a seventh point in time t7, the reset signal RS may transition from a low level to a high level, and thus, the reset transistor RX may be turned on.

The first transfer signal TS1 may transition (e.g., the image sensor may be configured to cause the first transfer signal TS1 to transition) from a low level to a high level at a third time point t3 and transition from a high level to a low level at a fifth time point t5. The first transfer transistor TX1 including the first extension 141 and the first connection portion 146 may be turned on (e.g., the image sensor may be configured to cause the first transfer transistor TX1 to turn on) based on the first transfer signal TS1 having a high level, such that photoelectric charges generated from the photoelectric conversion element PD can be accumulated in the floating diffusion area FD.

The second transfer signal TS2 may transition (e.g., the image sensor may be configured to cause the second transfer signal TS2 to transition) from a low level to a high level at a fourth time point t4 and then transition from a high level to a low level at a sixth time point t6. The second transfer transistor TX2 including the second extension 142, the third extension 143, and the second connection portion 147 may be turned on (e.g., the image sensor may be configured to cause the second transfer transistor TX2 to turn on) based on the second transfer signal TS2 having a high level, such that the photoelectric charges generated from the photoelectric conversion element PD can be accumulated in the floating diffusion area FD. That is, the second transfer signal TS2 may have a high level at a time different from a time at which the first transfer signal TS1 has a high level, and thus, the second transfer transistor TX2 may be turned on at a time different from a time at which the first transfer transistor TX1 is turned on (e.g., the image sensor may be configured to cause the second transfer transistor TX2 to be turned on at a time different from a time at which the image sensor causes the first transfer transistor TX1 to be turned on). For example, at least a portion of a time duration for which the second transfer signal TS2 has a high level may overlap with a time duration for which the first transfer signal TS1 has a high level.

Figure 12:
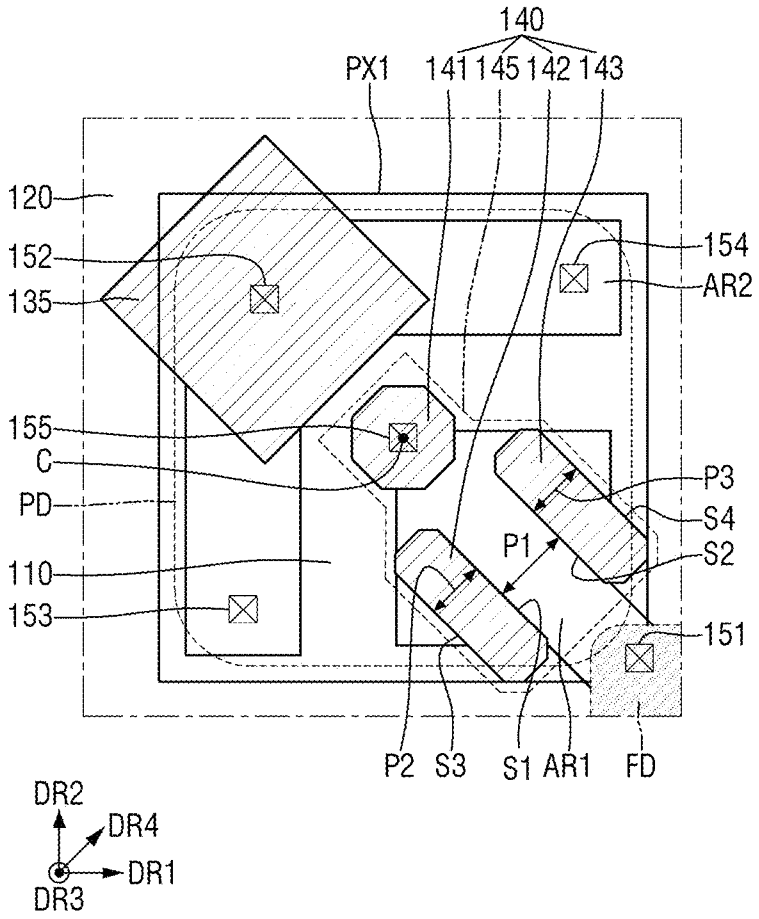
FIG. 12 is an illustrative layout diagram for illustrating a pixel of an image sensor according to some example embodiments.

FIG. 12 is an illustrative layout diagram for illustrating a pixel of an image sensor according to some example embodiments. For convenience of description, differences thereof from the descriptions as set forth above with reference to FIG. 1 to FIG. 7 will be described.

Referring to FIG. 12, in the image sensor according to some example embodiments, the second extension 142 may include a first sidewall S1 and a third sidewall S3 that are opposite to each other. The first sidewall S1 and the third sidewall S3 may face each other in the fourth direction DR4. A distance P2 between the first sidewall S1 and the third sidewall S3 may be constant along the first sidewall S1 and the third sidewall S3. The first sidewall S1 and the third sidewall S3 may be parallel with each other.

The third extension 143 may include a second sidewall S2 and a fourth sidewall S4 that are opposite to each other. The second sidewall S2 and the fourth sidewall S4 may face each other in the fourth direction DR4. A distance P3 between the second sidewall S2 and the fourth sidewall S4 may be constant along the second sidewall S2 and the fourth sidewall S4. The second sidewall S2 and the fourth sidewall S4 may be parallel with each other.

Figure 13:
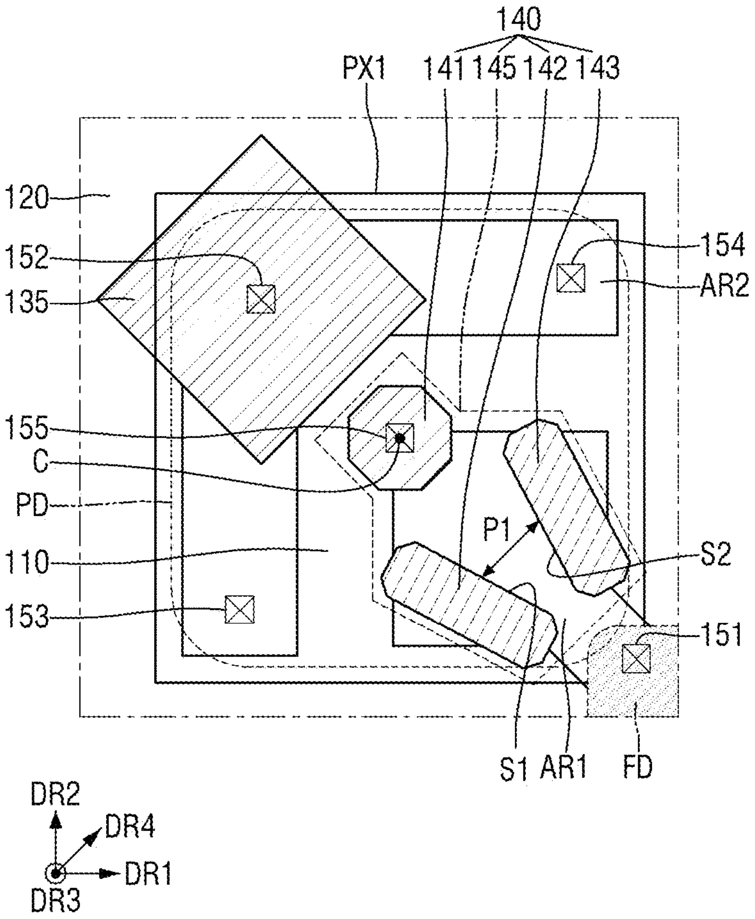
FIG. 13 is an illustrative layout diagram for illustrating a pixel of an image sensor according to some example embodiments.

FIG. 13 is an illustrative layout diagram for illustrating pixels of an image sensor according to some example embodiments. For convenience of description, differences thereof from the descriptions as set forth above with reference to FIG. 12 will be described.

Referring to FIG. 13, in the image sensor according to some example embodiments, a distance P1 between the first sidewall S1 of the second extension 142 and the second sidewall S2 of the third extension 143 may decrease as the first sidewall S1 and the second sidewall S2 extend toward the floating diffusion area FD.

Figure 14:
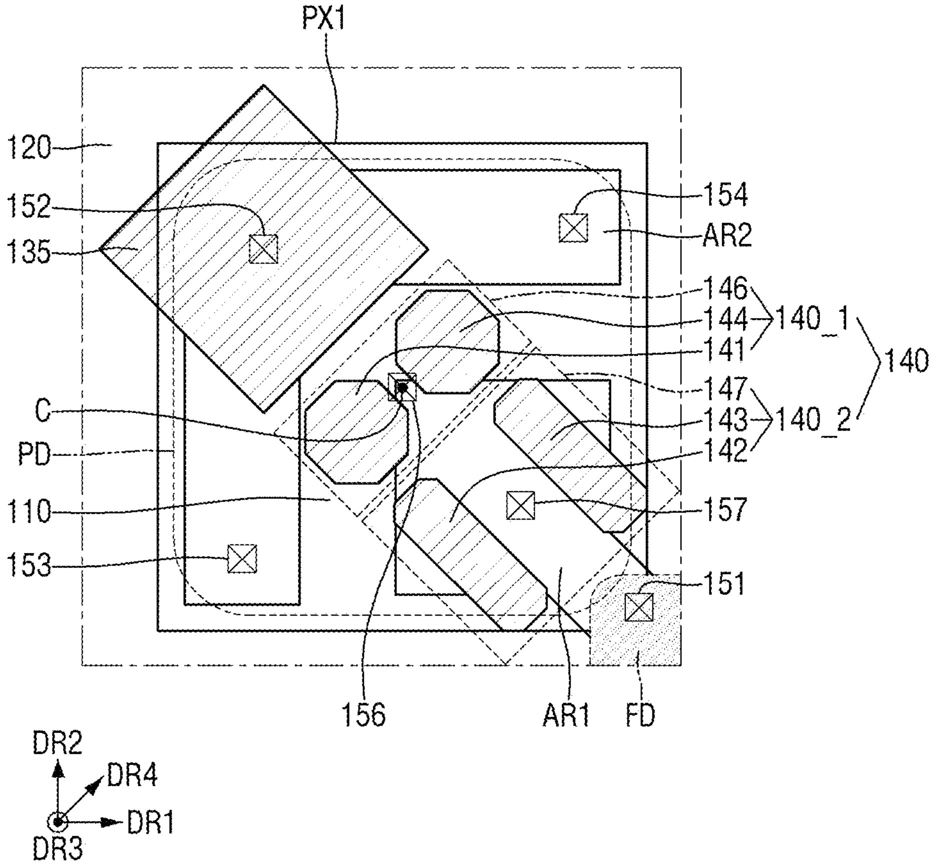
FIG. 14 is an illustrative layout diagram for illustrating a pixel of an image sensor according to some example embodiments.

FIG. 14 is an illustrative layout diagram for illustrating a pixel of an image sensor according to some example embodiments. For convenience of description, differences thereof from the descriptions as set forth above with reference to FIG. 8 to FIG. 11 will be described.

Referring to FIG. 14, in the image sensor according to some example embodiments, the transfer gate electrode 140 may include the first to fourth extensions 141, 142, 143, and 144, the first connection portion 146, and the second connection portion 147. The transfer gate electrode 140 may include the first transfer gate electrode 140_1 including the first extension 141, a fourth extension 144 and the first connection portion 146, and a second transfer gate electrode 140_2 including the second extension 142, the third extension 143 and the second connection portion 147.

The first extension 141 and the fourth extension 144 may be adjacent to the center C of the photoelectric conversion area PD on the first surface 100*a* of the first substrate 100. On the first surface 100*a* of the first substrate 100, the first extension 141 and the fourth extension 144 may be closer to the center C of the photoelectric conversion area PD than the second extension 142 and the third extension 143. For example, the center C of the photoelectric conversion area PD on the first surface 100*a* of the first substrate 100 may be disposed between the first extension 141 and the fourth extension 144. In some example embodiments, the fourth extension 144 may have a fourth depth extending from the first surface 100*a* of the first substrate 100 into the first substrate 100, where the fourth depth is greater than each of the second depth D2 and the third depth D3, wherein a bottom surface of the fourth extension 144 in the third direction DR3 is in the photoelectric conversion area PD.

The first connection portion 146 may extend along the first surface 100*a* of the first substrate 100 and be connected to the first and fourth extensions 141 and 144. The second connection portion 147 may extend along the first surface 100*a* of the first substrate 100 and be connected to the second and third extensions 142 and 143.

On the first surface 100*a* of the first substrate 100, the first transfer gate electrode 1401 may be closer to the center C of the photoelectric conversion area PD than the second transfer gate electrode 140_2.

Figure 15:
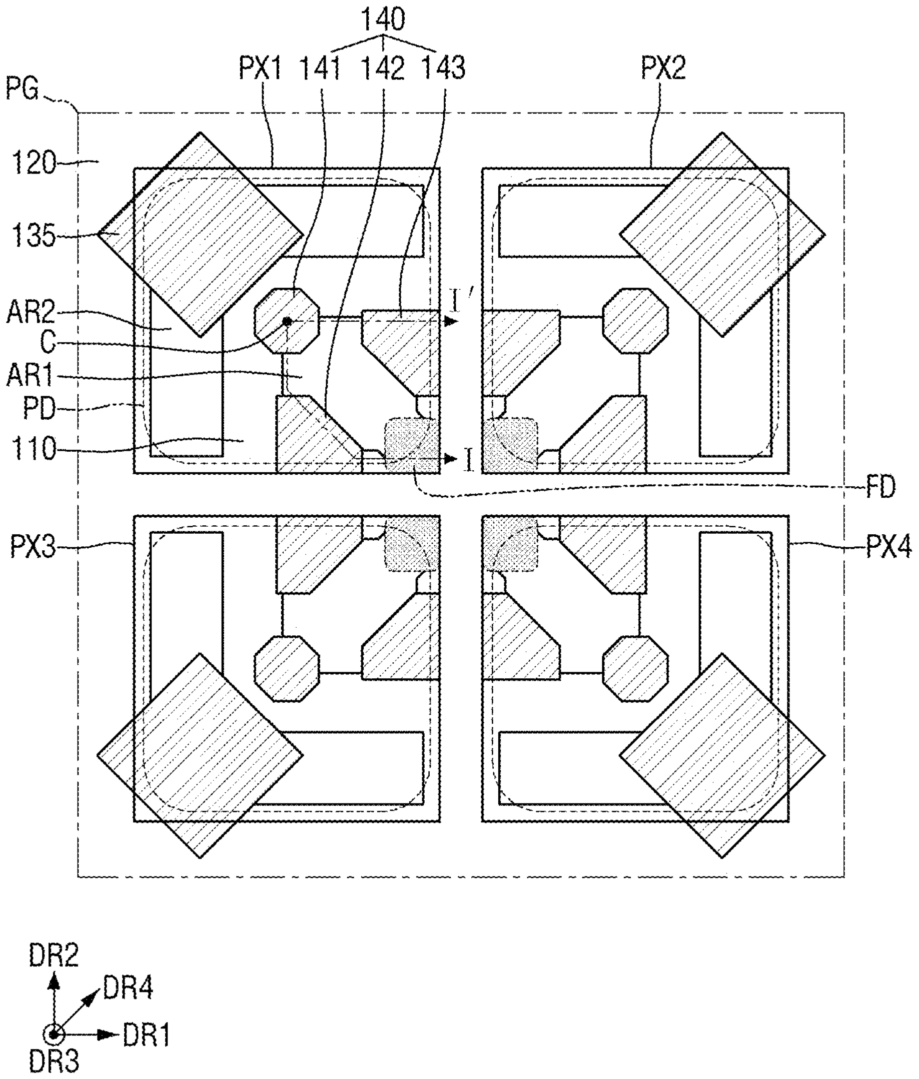
FIG. 15 is an illustrative layout diagram for illustrating a pixel of an image sensor according to some example embodiments.
Figure 16:
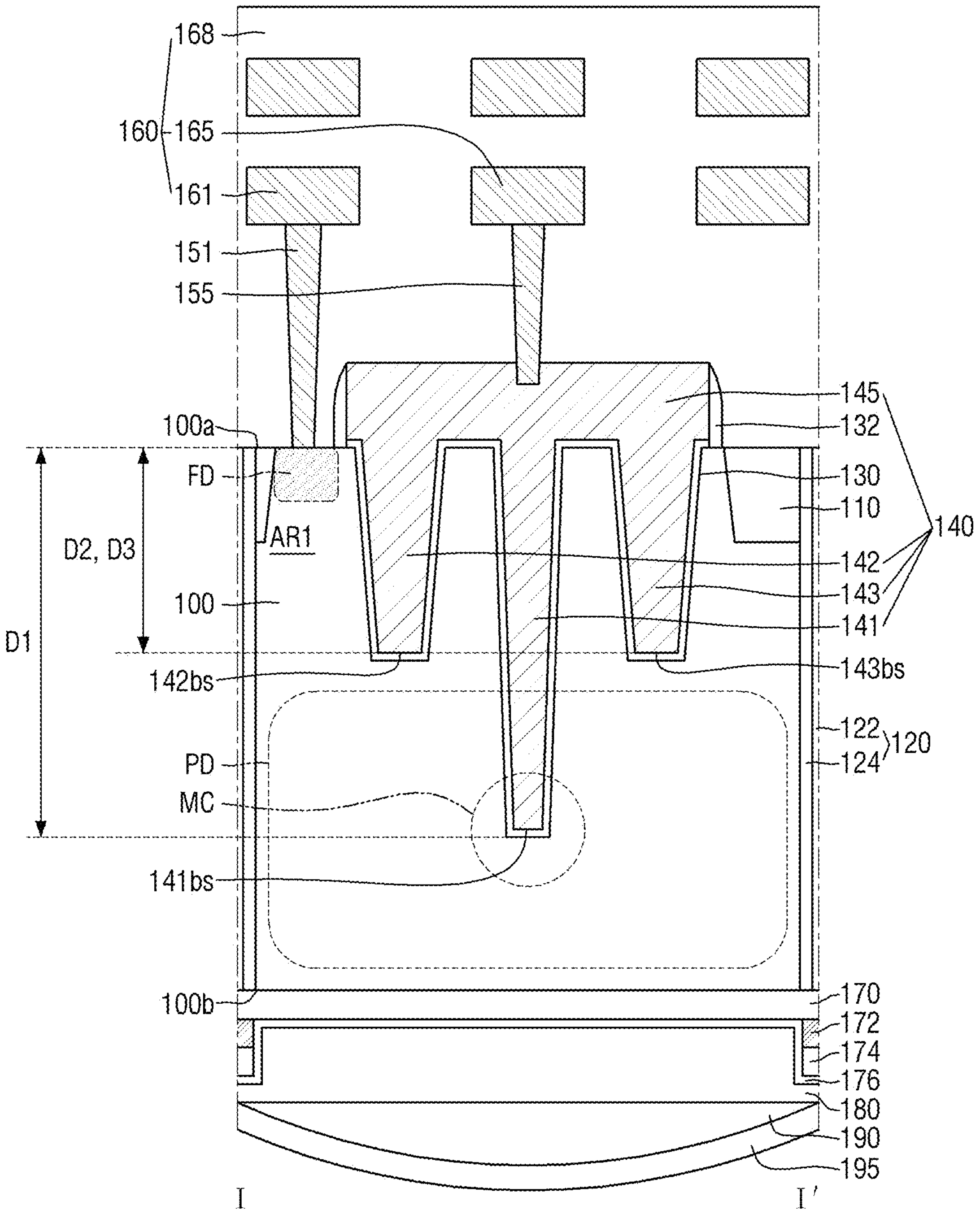
FIG. 16 is a cross-sectional view taken along cross-sectional view line I-I' of FIG. 15.

FIG. 15 is an illustrative layout diagram for illustrating a pixel of an image sensor according to some example embodiments. FIG. 16 is a cross-sectional view taken along cross-sectional view line I-I' of FIG. 15. For reference, FIG. 15 is an enlarged view of a PG portion of FIG. 3. For convenience of description, differences thereof from the descriptions as set forth above with reference to FIGS. 1 to 8 will be described.

Referring to FIGS. 15 and 16, in the image sensor according to some example embodiments, each of the first to fourth pixels PX1, PX2, PX3, and PX4 may each include the floating diffusion area FD. The floating diffusion area FD may be disposed at one corner of each of the first to fourth pixels PX1, PX2, PX3, and PX4. The floating diffusion area FD may be disposed in the first active area AR1 of each of the first to fourth pixels PX1, PX2, PX3, and PX4.

Figure 17:
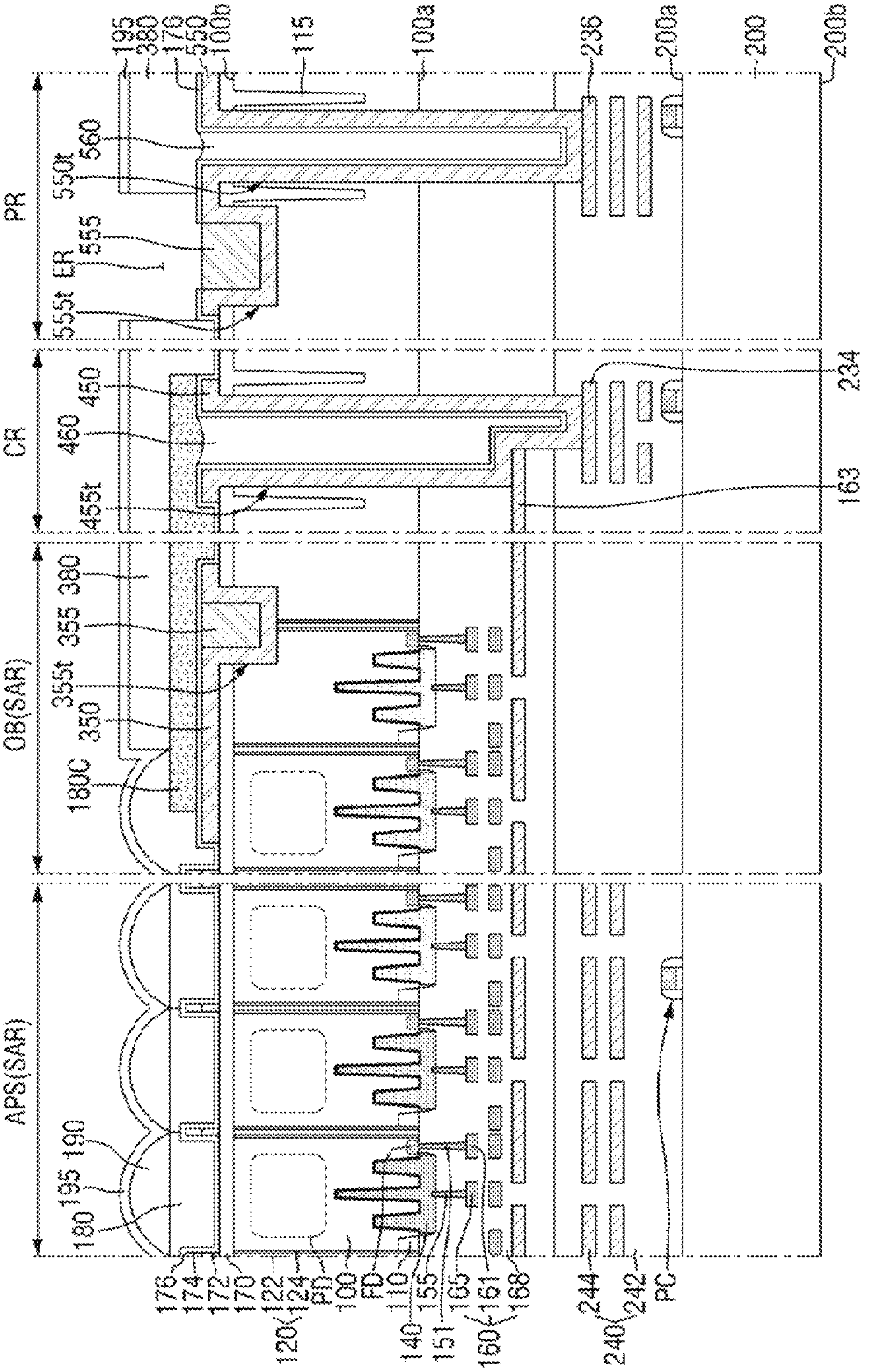
FIG. 17 is an illustrative cross-sectional view for illustrating an image sensor according to some example embodiments.

FIG. 17 is an illustrative cross-sectional view for illustrating an image sensor according to some example embodiments. FIG. 17 shows a cross-section of a pixel array PA in which pixels, each having the cross-section of FIG. 5, are arranged. For convenience of description, differences thereof from the descriptions as set forth above with reference to FIGS. 1 to 16 will be described.

Referring to FIG. 3 and FIG. 17, the image sensor according to some example embodiments may include a second substrate 200 and a second wiring structure 240.

The second substrate 200 may be made of bulk silicon or SOI (silicon-on-insulator). The second substrate 200 may be a silicon substrate, or may include a material other than silicon, such as silicon germanium, indium antimonide, lead telluride, indium arsenide, indium phosphide, gallium arsenide or gallium antimonide. Alternatively, the second substrate 200 may include a base substrate and an epitaxial layer formed on the base substrate.

The second substrate 200 may include a third surface 200*a* and a fourth surface 200*b* which are opposite to each other. The third surface 200*a* of the second substrate 200 may face the first surface 100*a* of the first substrate 100.

A peripheral circuit element PC may be formed on the third surface 200*a* of the second substrate 200. The peripheral circuit element PC may be electrically connected to a sensor array area SAR and may transmit and receive an electrical signal to and from each pixel of the sensor array area SAR. For example, the peripheral circuit element PC may include electronic elements constituting the control register block 11, the timing generator 12, the ramp signal generator 13, the row driver 14, the readout circuit 16 or the buffer 17 in FIG. 1.

The second wiring structure 240 may be formed on the third surface 200*a* of the second substrate 200. For example, the second wiring structure 240 may include a second inter-wiring insulating film 242 and various wiring patterns 244, 234, and 236 disposed in the second inter-wiring insulating film 242. In FIG. 17, the number of layers and an arrangement of the wiring patterns 244, 234, and 236 are only examples. However, the present inventive concepts are not limited thereto.

At least some of wiring patterns 244, 234, and 236 of the second wiring structure 240 may be connected to the peripheral circuit element PC. In some example embodiments, the second wiring structure 240 may include the third wiring pattern 244 in the sensor array area SAR, the fourth wiring pattern 234 in a connection area CR, and the fifth wiring pattern 236 in a pad area PR. In some example embodiments, the fourth wiring pattern 234 may be an uppermost wiring among a plurality of wirings in the connection area CR, and the fifth wiring pattern 236 may be an uppermost wiring among a plurality of wirings in the pad area PR.

The first wiring structure 160 may include the first wiring patterns 161 and 165 in the sensor array area SAR and a second wiring pattern 163 in the connection area CR. The first wiring patterns 161 and 165 may be electrically connected to pixels of the sensor array area SAR. At least a portion of the second wiring pattern 163 may be electrically connected to at least some of the first wiring patterns 161 and 165. Thus, the second wiring pattern 163 may be electrically connected to the pixels of the sensor array area SAR.

The image sensor according to some example embodiments may include a first connection structure 350, a second connection structure 450, and a third connection structure 550.

The first connection structure 350 may be formed in a light-blocking area OB.

The first connection structure 350 may be formed on the surface insulating film 170 and in the light-blocking area OB. The first connection structure 350 may contact a portion of the pixel isolation pattern 120. For example, a first trench 355*t* exposing the pixel isolation pattern 120 may be formed in the first substrate 100 and the surface insulating film 170 and in the light-blocking area OB. The first connection structure 350 may be formed in the first trench 355*t* and contact the pixel isolation pattern 120 and in the light-blocking area OB. In some example embodiments, the first connection structure 350 may extend along a profile of side and lower surfaces of the first trench 355*t*.

The first connection structure 350 may include, for example, at least one of titanium (Ti), titanium nitride (TiN), tantalum (Ta), tantalum nitride (TaN), tungsten (W), aluminum (Al), copper (Cu), or combinations thereof. However, the present inventive concepts are not limited thereto.

In some example embodiments, the first connection structure 350 may be electrically connected to the pixel isolation pattern 120 so as to apply a ground voltage or a negative voltage to the pixel isolation pattern 120. Accordingly, the electric charges generated due to ESD or the like may be discharged to the first connection structure 350 via the pixel isolation pattern 120. Thus, ESD bruise defect may be effectively reduced, minimized, or prevented.

In some example embodiments, a first pad 355 filling the first trench 355*t* may be formed on the first connection structure 350. The first pad 355 may include, for example, at least one of tungsten (W), copper (Cu), aluminum (Al), gold (Au), silver (Ag), or an alloy thereof. However, the present inventive concepts are not limited thereto.

In some example embodiments, the first protective film 176 may cover the first connection structure 350 and the first pad 355. For example, the first protective film 176 may extend along a profile of each of the first connection structure 350 and the first pad 355.

The second connection structure 450 may be formed in the connection area CR. The second connection structure 450 may be formed on the surface insulating film 170 and in the connection area CR. The second connection structure 450 may electrically connect the first wiring structure 160 and the second wiring structure 240 to each other. For example, a second trench 455*t* exposing the second wiring pattern 163 and the fourth wiring pattern 234 may be formed in the connection area CR. The second connection structure 450 may be formed in the second trench 455*t* so as to connect the second wiring pattern 163 and the fourth wiring pattern 234 to each other. In some example embodiments, the second connection structure 450 may extend along a profile of each of a side surface and a lower surface of the second trench 455*t*.

The second connection structure 450 may include, for example, at least one of titanium (Ti), titanium nitride (TiN), tantalum (Ta), tantalum nitride (TaN), tungsten (W), aluminum (Al), copper (Cu), or combinations thereof. However, the present inventive concepts are not limited thereto. In some example embodiments, the second connection structure 450 may be formed at the same level as that of the first connection structure 350.

In some example embodiments, the first protective film 176 may cover the second connection structure 450. For example, the first protective film 176 may extend along a profile of the second connection structure 450.

In some example embodiments, a first filling insulating film 460 filling the second trench 455*t* may be formed on the second connection structure 450. The first filling insulating film 460 may include, for example, at least one of silicon oxide, aluminum oxide, tantalum oxide, or combinations thereof. However, the present inventive concepts are not limited thereto.

The third connection structure 550 may be formed in the pad area PR. The third connection structure 550 may be formed on the surface insulating film 170 and in the pad area PR. The third connection structure 550 may electrically connect the second wiring structure 240 to an external device. For example, a third trench 550*t* exposing the fifth wiring pattern 236 may be formed in the pad area PR. The third connection structure 550 may be formed in the third trench 550*t* so as to contact the fifth wiring pattern 236. In addition, a fourth trench 555*t* may be formed in the first substrate 100 and in the pad area PR. The third connection structure 550 may be formed in the fourth trench 555*t* so as to be exposed. In some example embodiments, the third connection structure 550 may extend along a profile of each of a side surface and a lower surface of each of the third trench 550*t* and the fourth trench 555*t*.

The third connection structure 550 may include, for example, at least one of titanium (Ti), titanium nitride (TiN), tantalum (Ta), tantalum nitride (TaN), tungsten (W), aluminum (Al), copper (Cu), or combinations thereof. However, the present inventive concepts are not limited thereto. In some example embodiments, the third connection structure 550 may be formed at the same level as that of each of the first connection structure 350 and the second connection structure 450. As described herein, a "level" may refer to a distance from a reference location (e.g., the third surface 200*a* of the second substrate 200) in a reference direction (e.g., a vertical direction extending perpendicular to the third surface 200*a* of the second substrate 200). For example, elements at a same level may be a same distance from the reference location (e.g., the third surface 200*a* of the second substrate 200) in the reference direction (e.g., the vertical direction extending perpendicular to the third surface 200*a* of the second substrate 200).

In some example embodiments, a second filling insulating film 560 filling the third trench 550*t* may be formed on the third connection structure 550. The second filling insulating film 560 may include, for example, at least one of silicon oxide, aluminum oxide, tantalum oxide, or combinations thereof. However, the present inventive concepts are not limited thereto. In some example embodiments, the second filling insulating film 560 may be formed at the same level as that of the first filling insulating film 460.

In some example embodiments, a second pad 555 filling the fourth trench 555*t* may be formed on the third connection structure 550. The second pad 555 may include, for example, at least one of tungsten (W), copper (Cu), aluminum (Al), gold (Au), silver (Ag), or an alloy thereof. However, the present inventive concepts are not limited thereto. In some example embodiments, the second pad 555 may be formed at the same level as that of the first pad 355.

In some example embodiments, the first protective film 176 may cover the third connection structure 550. For example, the first protective film 176 may extend along a profile of the third connection structure 550. In some example embodiments, the first protective film 176 may expose the second pad 555.

In some example embodiments, an isolating pattern 115 may be formed in the first substrate 100. Although the isolating pattern 115 is shown to be formed only around each of the second connection structure 450 and the third connection structure 550, this is merely illustrative. In another example, the isolating pattern 115 may also be formed around the first connection structure 350. The isolating pattern 115 may include, for example, at least one of silicon oxide, silicon nitride, silicon oxynitride, aluminum oxide, hafnium oxide, or combinations thereof. However, the present inventive concepts are not limited thereto.

In some example embodiments, a width of the isolating pattern 115 may decrease as the isolating pattern 115 extends from the second surface 100*b* of the first substrate 100 toward the first surface 100*a* of the first substrate 100. This may be due to characteristics of an etching process for forming the isolating pattern 115. For example, the isolating pattern 115 may be BDTI (backside deep trench isolation) formed by a DTI (deep trench isolation) process on a back side of the first substrate 100. In some example embodiments, the isolating pattern 115 may be spaced apart from the first surface 100*a* of the first substrate 100.

In some example embodiments, a light-blocking color filter 180C may be formed on the first connection structure 350 and the second connection structure 450. For example, the light-blocking color filter 180C may be formed to cover a portion of the first protective film 176 in each of the light-blocking area OB and the connection area CR. The light-blocking color filter 180C may prevent light from being incident to the first substrate 100.

In some example embodiments, a third protective film 380 may be formed on the light-blocking color filter 180C. For example, the third protective film 380 may be formed to cover a portion of the first protective film 176 in each of the light-blocking area OB, the connection area CR, and the pad area PR. In some example embodiments, the second protective film 195 may extend along a surface of the third protective film 380. The third protective film 380 may include, for example, a light-transmissive resin. However, the present inventive concepts are not limited thereto. In some example embodiments, the third protective film 380 may be formed at the same level as that of the micro lens 190.

In some example embodiments, the second protective film 195 and the third protective film 380 may expose the second pad 555. For example, an exposure opening ER exposing the second pad 555 may be formed in the second protective film 195 and the third protective film 380. Accordingly, the second pad 555 may be connected to an external device or the like and may transmit/receive an electrical signal to/from the external device. That is, the second pad 555 may be an input/output pad of the image sensor according to some example embodiments.

FIG. 18, FIG. 19, FIG. 20, and FIG. 21 are respective illustrative layout diagrams for illustrating pixels of image sensors according to some example embodiments. For convenience of description, differences thereof from the descriptions as set forth above with reference to FIG. 1 to FIG. 17 will be described.

Figure 18:
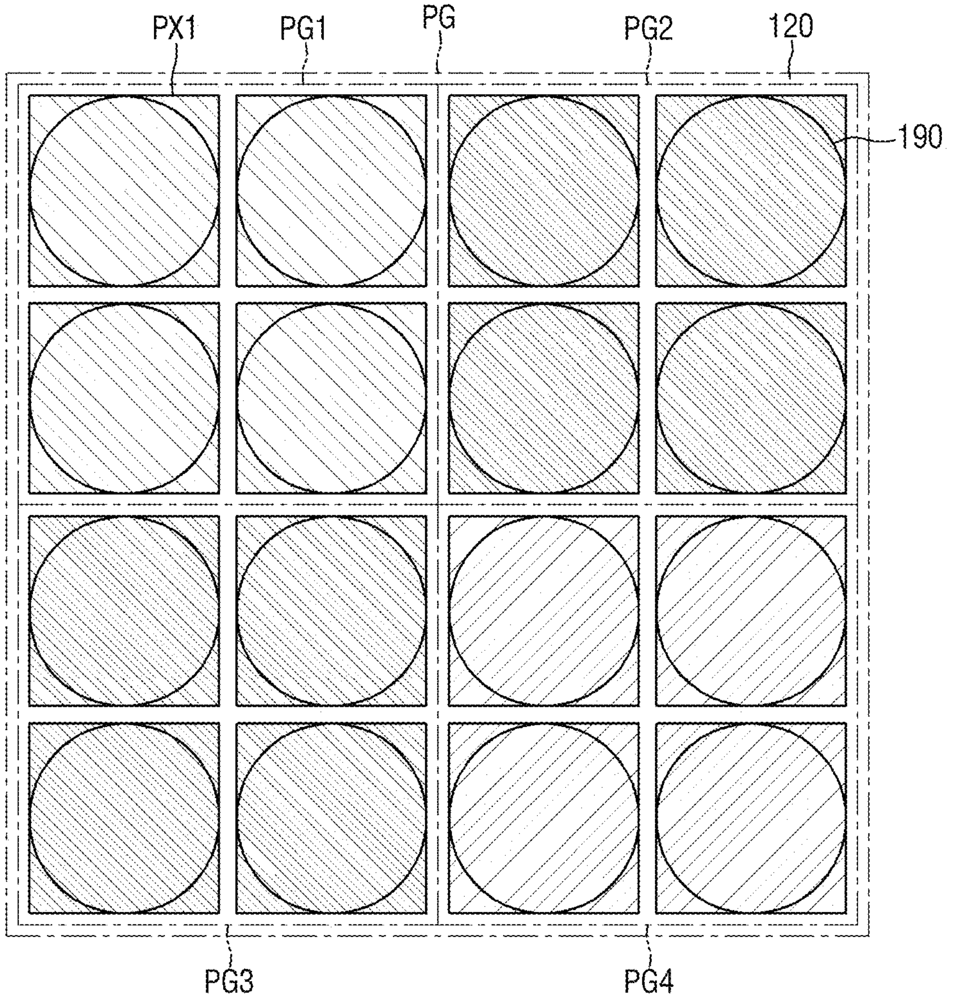
FIG. 18, FIG. 19, FIG. 20, and FIG. 21 are illustrative layout diagrams for illustrating a pixel of an image sensor according to some example embodiments.

Referring to FIG. 18, a pixel group PG of the image sensor according to some example embodiments may include first to fourth pixel groups PG1, PG2, PG3, and PG4. Each of the first to fourth pixel groups PG1, PG2, PG3, and PG4 may include a plurality of first pixels PX1. For example, each of the first to fourth pixel groups PG1, PG2, PG3, and PG4 may include the first pixels PX1 arranged in 2 rows and 2 columns.

Color filters (for example, 180 in FIG. 6) respectively arranged on the first pixels PX1 may be arranged in a Bayer pattern form. For example, a color filter disposed on each of the first pixels PX1 in the first pixel group PG1 may include a first color filter, a color filter disposed on each of the first pixels PX1 in each of the second pixel group PG2 and the third pixel group PG3 may include a second color filter, and a color filter disposed on each of the first pixels PX1 in the fourth pixel group PG4 may include a third color filter. For example, the first color filter may be a red color filter, the second color filter may be a green color filter, and the third color filter may be a blue color filter.

Figure 19:
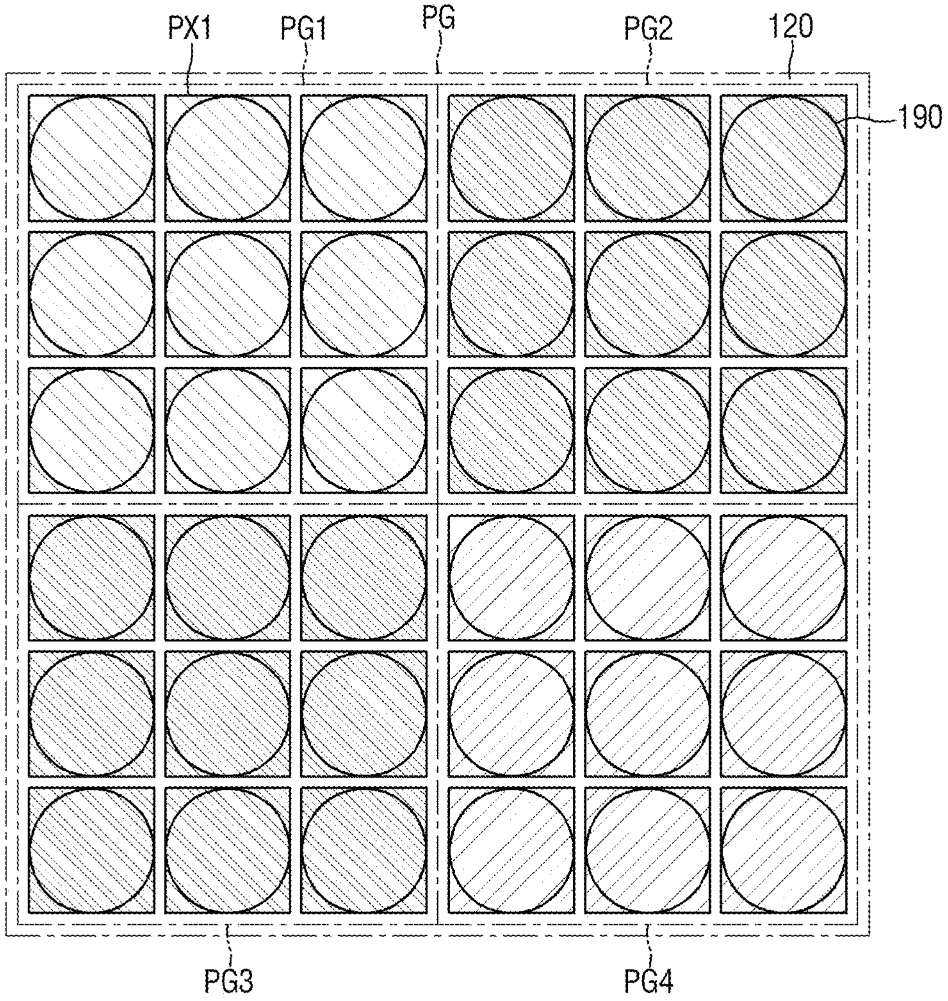

Referring to FIG. 19, in the image sensor according to some example embodiments, each of the first to fourth pixel groups PG1, PG2, PG3, and PG4 may include the first pixels PX1 arranged in three rows and three columns.

Figure 20:
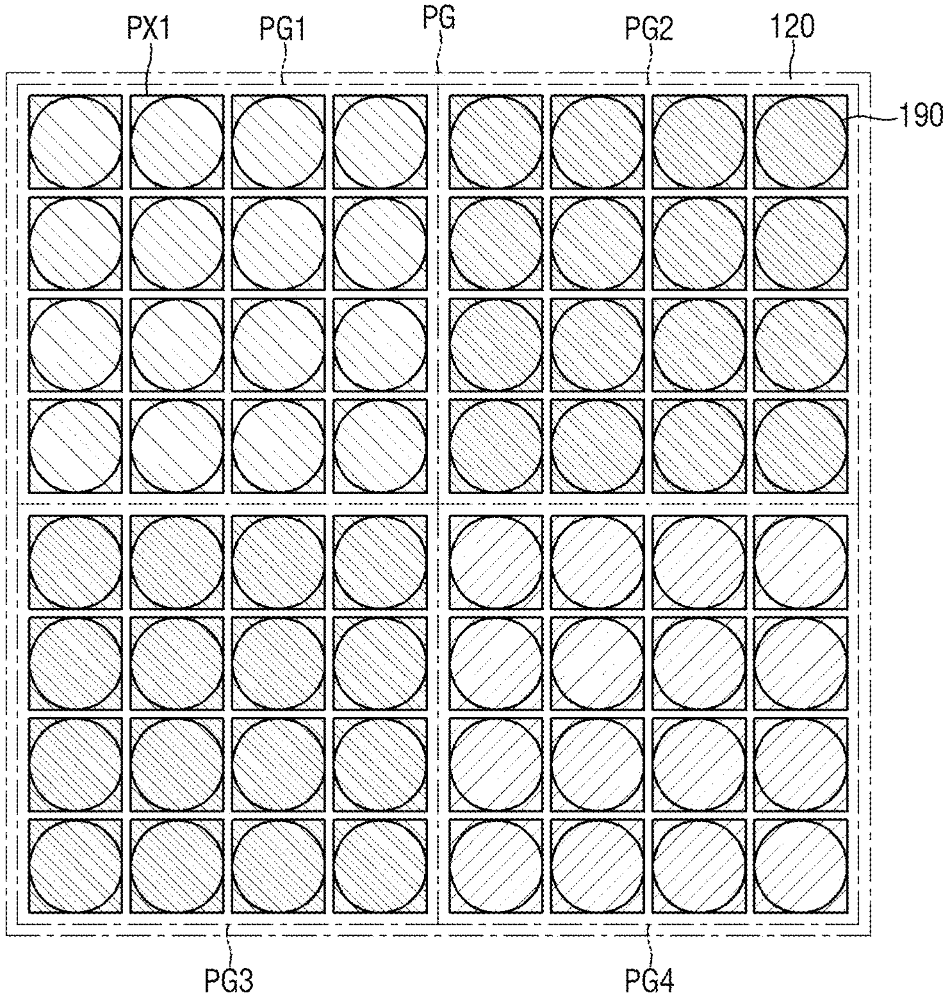

Referring to FIG. 20, in the image sensor according to some example embodiments, each of the first to fourth pixel groups PG1, PG2, PG3, and PG4 may include the first pixels PX1 arranged in four rows and four columns.

Figure 21:
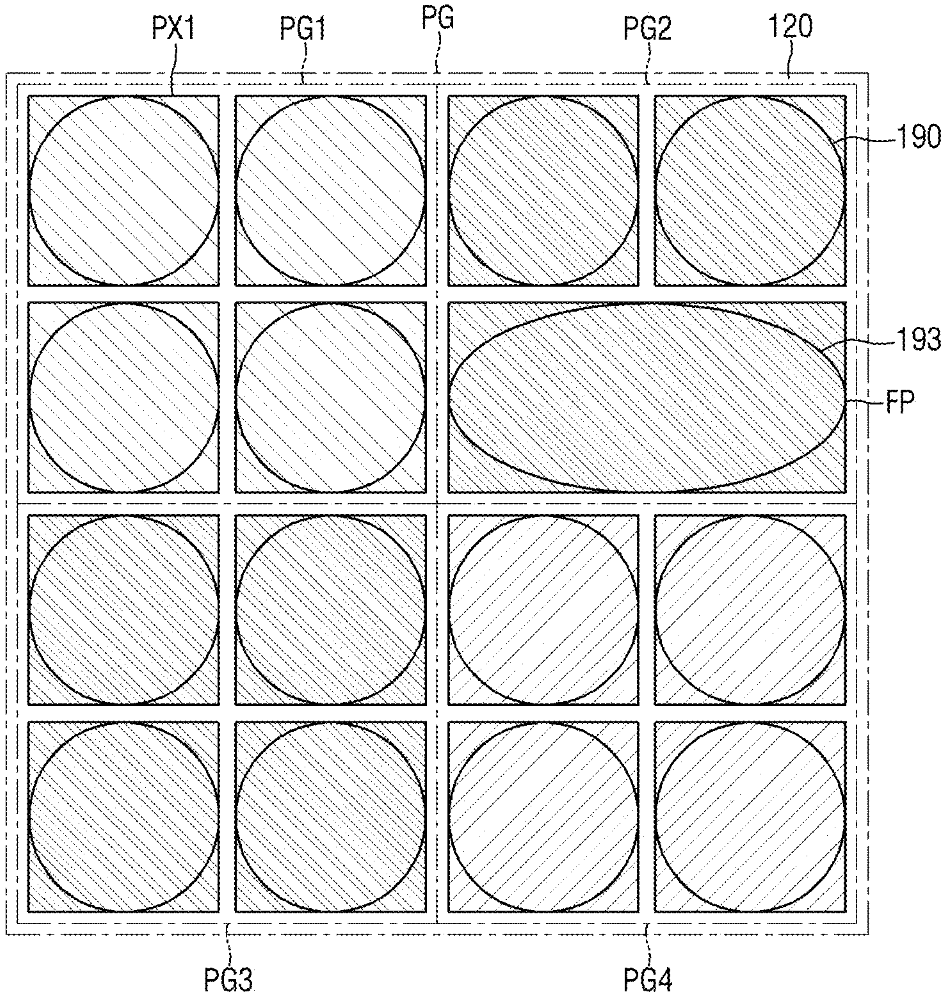

Referring to FIG. 21, the image sensor according to some example embodiments may include a focus pixel FP. The number and an arrangement of focus pixels FP are merely illustrative, and the technical idea of the present inventive concepts are not limited thereto.

The focus pixel FP may include two sub-pixels. The focus pixel FP may perform an auto focus (AF) function. Phase detection AF (PDAF) may be performed using the sub-pixel. The sub-pixel may have a structure similar to that of the first pixel PX1. The micro lens 190 may be positioned so as to correspond to the first pixel PX1, and a micro lens 193 may be positioned so as to correspond to the focus pixel FP.

Figure 22:
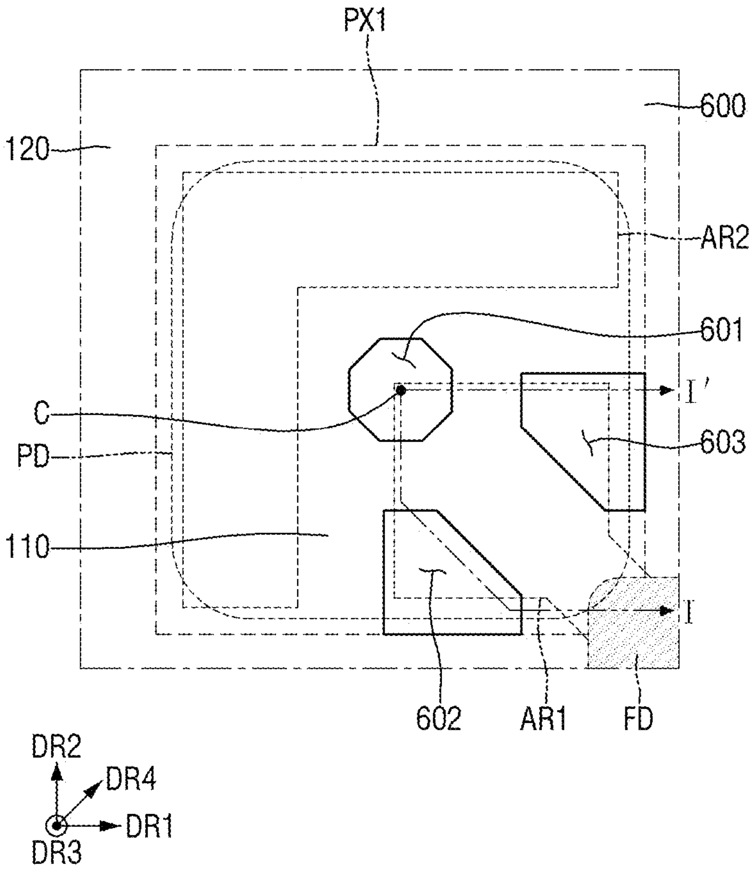
FIG. 22 and FIG. 23 are diagrams of intermediate structures corresponding to steps for illustrating a method for manufacturing an image sensor according to some example embodiments.
Figure 23:
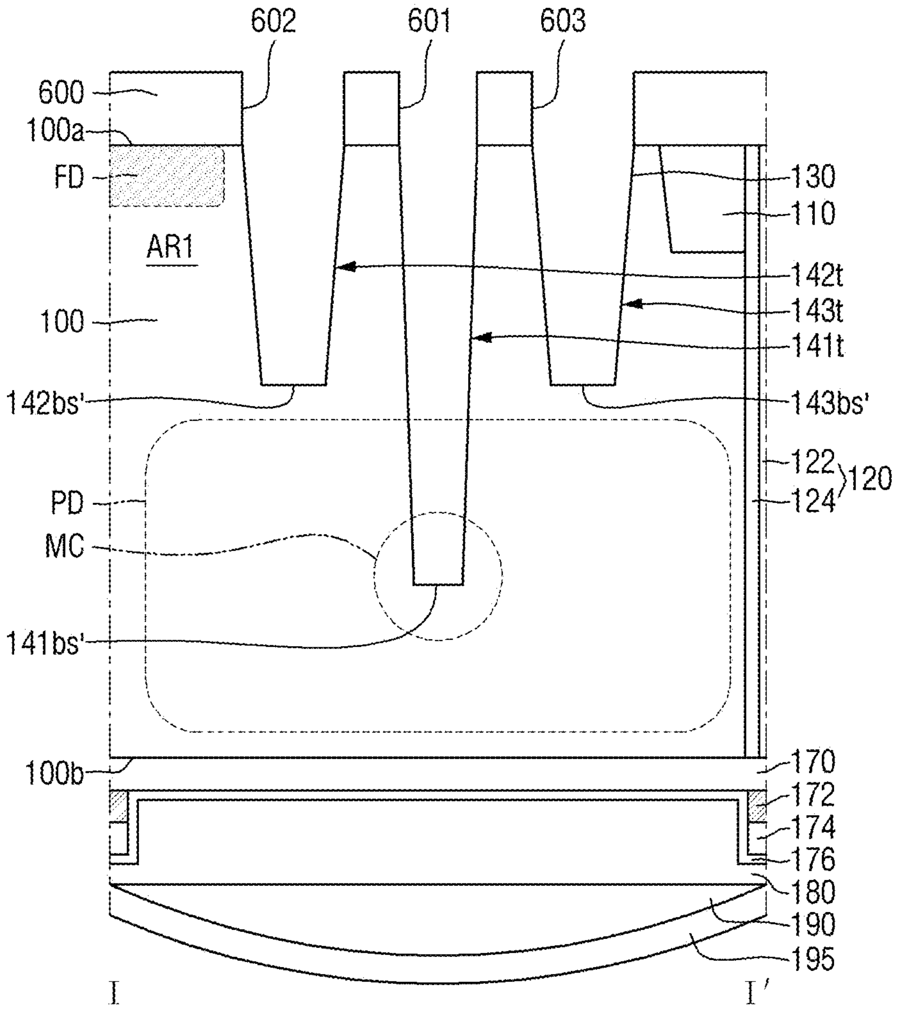

FIG. 22 and FIG. 23 are diagrams of intermediate structures corresponding to intermediate steps for illustrating a method for manufacturing an image sensor according to some example embodiments. For reference, FIG. 23 is a cross-sectional view taken along cross-sectional view line I-I' of FIG. 22. For convenience of description, differences thereof from the descriptions as set forth above with reference to FIG. 1 to FIG. 21 will be described.

Referring to FIG. 22 and FIG. 23, the first substrate 100 including the first surface **100*a* and the second surface 100*b* opposite to each other may be provided. The photoelectric conversion area PD may be formed in the first substrate 100. The element isolation pattern 110 defining each of the first active area AR1 and the second active area AR2 may be formed in the first substrate 100. The pixel isolation pattern 120 defining a pixel (for example, the first pixel PX1) may be formed in the first substrate 100. The floating diffusion area FD may be formed in the first substrate 100**.

Subsequently, a mask 600 may be formed on the first surface **100*a* of the first substrate 100. The mask 600 may have a first opening 601, a second opening 602 and a third opening 603 defined therein. The first opening 601 may be disposed at the center C of the photoelectric conversion area PD on the first surface 100*a* of the first substrate 100. Each of the second opening 602 and the third opening 603 may be disposed at an edge of the first pixel PX1. The second opening 602 and the third opening 603** may be adjacent to the floating diffusion area FD.

The first substrate 100 may then be etched using the mask 600. A portion of the first substrate 100 exposed through each of the first to third openings 601, 602, and 603 may be etched to form each of first to third trenches **141*t*, 142*t*, and 143*t*. Each of the first to third trenches 141*t*, 142*t*, and 143*t* may extend from the first surface 100*a* of the first substrate 100 toward the second surface 100*b*. That is, the first to third trenches 141*t*, 142*t*, and 143*t* may be formed using one mask 600**.

On the first surface **100*a* of the first substrate 100, an area size of the first opening 601 may be larger than each of an area size of the second opening 602 and an area size of the third opening 603. Accordingly, in the etching process using the mask 600, a portion of the first substrate 100 exposed through the first opening 601 may be etched by an amount larger than an amount by which each of a portion of the first substrate 100 exposed through the second opening 602 and a portion of the first substrate 100 exposed through the third opening 603 is etched. Accordingly, a depth of the first trench 141*t* may be greater than a depth of each of the second trench 142*t* and the third trench 143*t***.

A bottom surface **141*bs*' of the first trench 141*t* may be disposed in the photoelectric conversion area PD. The bottom surface 141*bs*' of the first trench 141*t* may be disposed in the maximum impurity concentration area MC of the photoelectric conversion area PD. Each of a bottom surface 142*bs*' of the second trench 142*t* and a bottom surface 143*bs*' of the third trench 143*t* may be disposed in the first substrate 100. Each of the bottom surface 142*bs*' of the second trench 142*t* and the bottom surface 143*bs*' of the third trench 143*t* may overlap the photoelectric conversion area PD in the third direction DR3 and may be spaced therefrom in the third direction DR3**.

Subsequently, referring to FIG. 6, the mask 600 may be removed. The gate dielectric film 130 extending along the first to third trenches **141*t*, 142*t*, and 143*t* may be formed. The first to third extensions 141, 142, and 143 respectively filling remaining portions of the first to third trenches 141*t*, 142*t*, and 143*t* may be formed on the gate dielectric layer 130. The connection portion 145 may be formed on the first to third extensions 141, 142, and 143. Accordingly, the transfer gate electrode 140 may be formed. Accordingly, in the image sensor according to some example embodiments, on the first surface 100*a* of the first substrate 100, an area size of the first extension 141 may be larger than each of an area size of the second extension 142 and an area size of the third extension 143. The gate spacer 132 may be formed on the sidewall of the connection portion 145 of the transfer gate electrode 140**.

Subsequently, the source/drain contact 151, the gate contact 155, and the first wiring structure 160 may be formed. The source/drain contact 151 may be formed on the floating diffusion area FD, and the gate contact 155 may be formed on the transfer gate electrode 140. The first wiring structure 160 may include the first inter-wiring insulating film 168 and the first wiring patterns 161 and 165 disposed in the first inter-wiring insulating film 168.

Subsequently, the surface insulating film 170, the grid pattern 172 and 174, the first protective film 176, the color filter 180, the micro lens 190 and the second protective film 195 may be sequentially formed on the second surface 100*b* of the first substrate 100.

Figure 24:
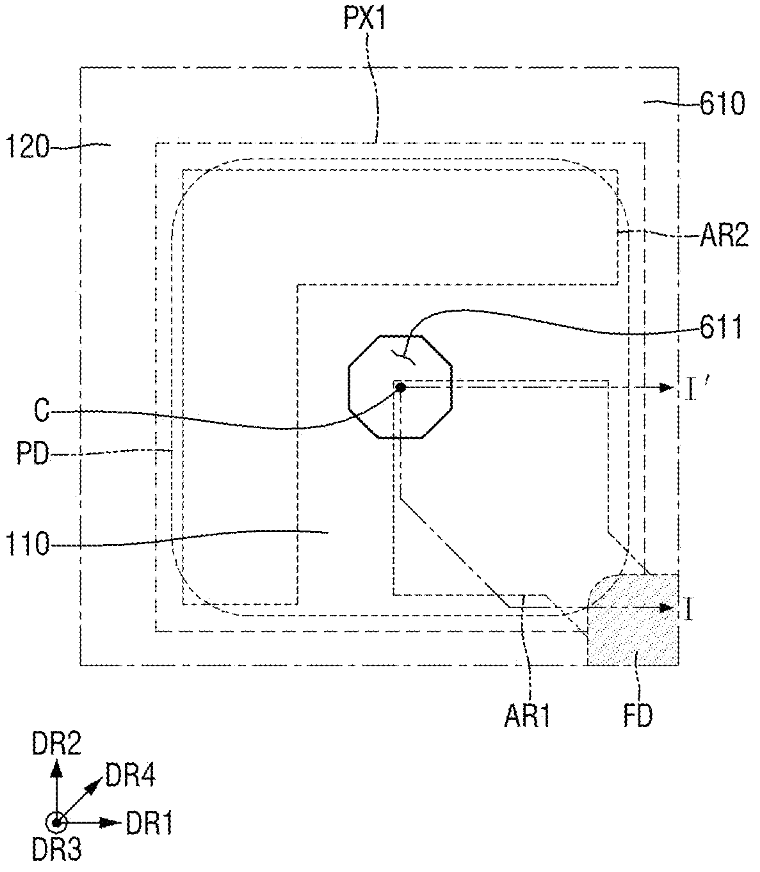
FIG. 24, FIG. 25, and FIG. 26 are diagrams of intermediate structures corresponding to steps for illustrating a method for manufacturing an image sensor according to some example embodiments.
Figure 25:
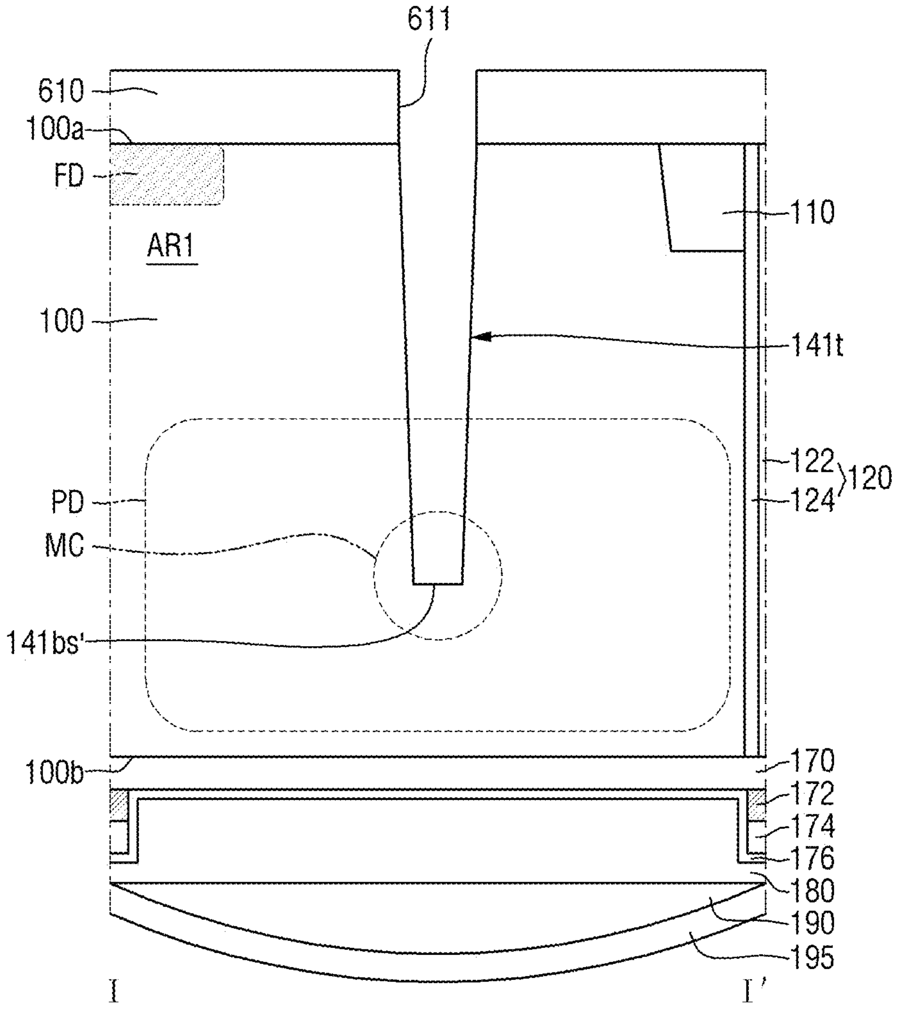
Figure 26:
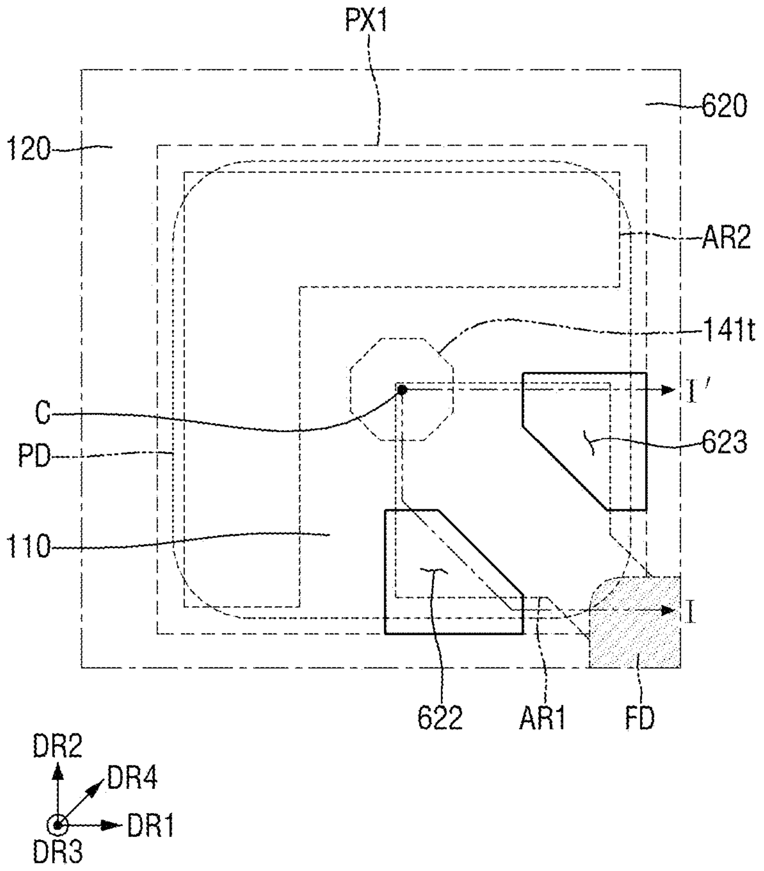

FIGS. 24 to 26 are diagrams of intermediate structures corresponding to intermediate steps for illustrating a method for manufacturing an image sensor according to some example embodiments. For reference, FIG. 25 is a cross-sectional view taken along cross-sectional view line I-I' of FIG. 24. For convenience of description, differences thereof from the descriptions as set forth above with reference to FIG. 1 to FIG. 21 will be described.

Referring to FIG. 24 and FIG. 25, the first substrate 100 including the first surface 100*a* and the second surface 100*b* opposite to each other may be provided. The photoelectric conversion area PD may be formed in the first substrate 100. The element isolation pattern 110 defining each of the first active area AR1 and the second active area AR2 may be formed in the first substrate 100. The pixel isolation pattern 120 defining a pixel (for example, the first pixel PX1) may be formed in the first substrate 100. The floating diffusion area FD may be formed in the first substrate 100.

Subsequently, a first mask 610 may be formed on the first surface 100*a* of the first substrate 100. The first mask 610 may have a first opening 611 defined therein. The first opening 611 may be disposed at the center C of the photoelectric conversion area PD on the first surface 100*a* of the first substrate 100.

Subsequently, the first substrate 100 may be etched using the first mask 610. A portion of the first substrate 100 exposed through the first opening 611 may be etched to form the first trench 141*t*. The first trench 141*t* may extend from the first surface 100*a* of the first substrate 100 toward the second surface 100*b*. The bottom surface 141*bs*' of the first trench 141*t* may be disposed in the photoelectric conversion area PD. The bottom surface 141*bs*' of the first trench 141*t* may be disposed in the maximum impurity concentration area MC of the photoelectric conversion area PD. The first mask 610 may then be removed.

Next, referring to FIGS. 26 and 23, a second mask 620 may be formed on the first surface 100*a* of the first substrate 100. The second mask 620 may have a second opening 622 and a third opening 623 defined therein. Each of the second opening 622 and the third opening 623 may be disposed at an edge of the first pixel PX1. The second opening 622 and the third opening 623 may be adjacent to the floating diffusion area FD.

Subsequently, the first substrate 100 may be etched using the second mask 620. A portion of the first substrate 100 exposed through each of the second and third openings 622 and 623 may be etched to form each of the second and third trenches 142*t* and 143*t*. Each of the second and third trenches 142*t* and 143*t* may extend from the first surface 100*a* of the first substrate 100 toward the second surface 100*b* thereof. The second mask 620 may then be removed.

Subsequently, the image sensor as described using FIG. 6 may be manufactured. Alternatively, after the second and third trenches 142*t* and 143*t* have been formed using the second mask 620, the first trench 141*t* may be formed using the first mask 610.

The first to third trenches 141*t*, 142*t*, and 143*t* are formed using the two masks 610 and 620. Thus, on the first surface 100*a* of the first substrate 100, an area size of the first opening 611 may be set in a separate manner from each of an area size of the second opening 622 and an area size of the third opening 623. For example, on the first surface 100*a* of the first substrate 100, the area size of the first opening 611 may be smaller than or equal to the area size of each of the second opening 622 and the third opening 623. Accordingly, in the image sensor according to some example embodiments, on the first surface 100*a* of the first substrate 100, an area size of the first extension 141 may be smaller than or equal to an area size of each of the second extension 142 and the third extension 143.

Although some example embodiments of the present inventive concepts have been described above with reference to the accompanying drawings, the present inventive concepts are not limited to such example embodiments, but may be implemented in various different forms. A person skilled in the art will be able to appreciate that the present inventive concepts may be embodied in other concrete forms without changing the technical spirit or essential characteristics of the present inventive concepts. Therefore, it should be understood that the example embodiments as described above are not restrictive but illustrative in all respects.

What is claimed is:

1. An image sensor, comprising:

a substrate including a first surface and a second surface, wherein the first surface and the second surface are opposite to each other in a first direction;

a plurality of pixels, each pixel of the plurality of pixels including a photoelectric conversion area in the substrate; and a transfer gate electrode on one pixel of the plurality of pixels, wherein the transfer gate electrode overlaps the photoelectric conversion area of the one pixel in the first direction, wherein the substrate contains impurities of a first conductivity type, wherein the photoelectric conversion area contains impurities of a second conductivity type different from the first conductivity type, wherein the transfer gate electrode includes a first extension extending from the first surface of the substrate into the substrate, wherein the first extension has a first depth, a second extension extending from the first surface of the substrate into the substrate, wherein the second extension has a second depth, and a third extension extending from the first surface of the substrate into the substrate, wherein the third extension has a third depth, wherein the first depth is larger than each of the second depth and the third depth, wherein a bottom surface of the first extension is in the photoelectric conversion area, and wherein each of a bottom surface of the second extension and a bottom surface of the third extension is spaced apart from the photoelectric conversion area in the first direction.

2. The image sensor of claim 1, wherein the first extension is at a center of the photoelectric conversion area on the first surface of the substrate.

3. The image sensor of claim 1, wherein the bottom surface of the first extension is at a center in the first direction of the photoelectric conversion area.

4. The image sensor of claim 1, further comprising a floating diffusion area in the substrate, wherein a spacing between each of the second extension and the third extension and the floating diffusion area is smaller than a spacing between the first extension and the floating diffusion area.

5. The image sensor of claim 1, wherein the transfer gate electrode further includes a connection portion on the first surface of the substrate so as to connect the first extension, the second extension, and the third extension to each other.

6. The image sensor of claim 1, wherein the transfer gate electrode further includes:

a first connection portion on the first surface of the substrate and connected to the first extension; and a second connection portion on the first surface of the substrate and connected to the second extension and the third extension, wherein the image sensor further comprises:

a first gate contact on the first connection portion; and a second gate contact on the second connection portion.

7. The image sensor of claim 6, wherein the image sensor is configured to:

cause a first transfer signal applied to the first gate contact to transition from a first logic level to a second logic level at a first time point, and cause a second transfer signal applied to the second gate contact to transition from the first logic level to the second logic level at a second time point different from the first time point.

8. The image sensor of claim 1, wherein the transfer gate electrode further includes a fourth extension extending from the first surface of the substrate into the substrate, wherein the fourth extension has a fourth depth, wherein the fourth depth is greater than each of the first depth and the second depth, wherein a bottom surface of the fourth extension in the first direction is in the photoelectric conversion area.

9. The image sensor of claim 8, wherein a spacing between each of the first extension and the fourth extension and a center of the photoelectric conversion area on the first surface of the substrate is smaller than a spacing between each of the second extension and the third extension and the center of the photoelectric conversion area on the first surface of the substrate.

10. The image sensor of claim 1, wherein:

the second extension includes a first sidewall, the third extension includes a second sidewall facing the first sidewall, and a distance between the first sidewall and the second sidewall is constant along the first sidewall and the second sidewall.

11. The image sensor of claim 10, wherein:

the second extension further includes a third sidewall opposite to the first sidewall, the third extension further includes a fourth sidewall opposite to the second sidewall, and each of the distance between the first sidewall and the third sidewall and a distance between the second sidewall and the fourth sidewall is constant along the first sidewall, the second sidewall, the third sidewall, and the fourth sidewall.

12. The image sensor of claim 1, further comprising a floating diffusion area in the substrate, wherein the second extension includes a first sidewall, wherein the third extension includes a second sidewall facing the first sidewall, wherein a distance between the first sidewall and the second sidewall decreases as each of the first sidewall and the second sidewall extends toward the floating diffusion area.

13. The image sensor of claim 1, further comprising:

a pixel isolation pattern extending from the second surface of the substrate into the substrate so as to define each of the plurality of pixels; and a floating diffusion area in the substrate and between first to fourth pixels adjacent to each other among the plurality of pixels, wherein the pixel isolation pattern is spaced apart from the floating diffusion area in the first direction.

14. The image sensor of claim 1, further comprising:

a pixel isolation pattern extending from the first surface of the substrate to the second surface of the substrate so as to define each of the plurality of pixels; and a floating diffusion area in the substrate and between first to fourth pixels adjacent to each other among the plurality of pixels, wherein the pixel isolation pattern does not overlap the floating diffusion area in the first direction.

15. An image sensor, comprising:

a substrate including a first surface and a second surface, wherein the first surface and the second surface are opposite to each other in a first direction;

a plurality of pixels, each pixel of the plurality of pixels including a photoelectric conversion area in the substrate; and a transfer gate electrode on one pixel of the plurality of pixels, wherein the transfer gate electrode includes a first extension, a second extension, and a third extension, wherein the first extension, the second extension, and the third extension are above the photoelectric conversion area of the one pixel and extending into the substrate, wherein the substrate contains impurities of a first conductivity type, wherein the photoelectric conversion area contains impurities of a second conductivity type different from the first conductivity type, wherein a first depth of the first extension in the substrate is larger than each of a second depth of the second extension in the substrate and a third depth of the third extension in the substrate, and wherein a spacing between the first extension and a center of the photoelectric conversion area on the first surface of the substrate is smaller than each of a spacing between the second extension and the center of the photoelectric conversion area on the first surface of the substrate and a spacing between the third extension and the center of the photoelectric conversion area on the first surface of the substrate.

16. The image sensor of claim 15, wherein:

the plurality of pixels include first to fourth pixels adjacent to each other, wherein the image sensor further comprises a floating diffusion area in the substrate and between the first to fourth pixels, wherein each of a spacing between the second extension and the floating diffusion area and a spacing between the third extension and the floating diffusion area is smaller than a spacing between the first extension and the floating diffusion area.

17. The image sensor of claim 15, wherein each of the plurality of pixels further includes a floating diffusion area, wherein each of a spacing between the second extension and the floating diffusion area and a spacing between the third extension and the floating diffusion area is smaller than a spacing between the first extension and the floating diffusion area.

18. The image sensor of claim 15, wherein the transfer gate electrode further includes a fourth extension disposed above the photoelectric conversion area and extending into the substrate, wherein a depth of the fourth extension in the substrate is larger than each of the second depth and the third depth, wherein a spacing between the fourth extension and the center of the photoelectric conversion area on the first surface of the substrate is smaller than each of the spacing between the second extension and the center of the photoelectric conversion area on the first surface of the substrate and the spacing between the third extension and the center of the photoelectric conversion area on the first surface of the substrate.

19. The image sensor of claim 18, wherein the center of the photoelectric conversion area on the first surface of the substrate is between the first extension and the fourth extension.

20. An image sensor, comprising:

a substrate including a first surface and a second surface, wherein the first surface and the second surface are opposite to each other in a first direction;

a plurality of pixels, each pixel of the plurality of pixels including a photoelectric conversion area in the substrate;

a pixel isolation pattern in the substrate so as to define the plurality of pixels;

a color filter on the second surface of the substrate;

a micro lens on the color filter;

a transfer gate electrode on one pixel of the plurality of pixels, wherein the transfer gate electrode overlaps the photoelectric conversion area of the one pixel in the first direction, and the transfer gate electrode includes a first extension, a second extension, and a third extension, wherein the first extension, the second extension, and the third extension are extending from the first surface of the substrate into the substrate; and a floating diffusion area in the substrate, wherein the floating diffusion area is in a corner of each of the plurality of pixels, wherein the substrate contains impurities of a first conductivity type, wherein the photoelectric conversion area contains impurities of a second conductivity type different from the first conductivity type, wherein the first extension is adjacent to a center of the photoelectric conversion area on the first surface of the substrate, wherein each of the second extension and the third extension is adjacent to the floating diffusion area, wherein a bottom surface of the first extension is at a vertical center of the photoelectric conversion area in the first direction, and wherein each of a bottom surface of the second extension and a bottom surface of the third extension are spaced apart from the photoelectric conversion area in the first direction.

* * * * *